US 12,414,447 B2

(12) United States Patent
Park et al.

(10) Patent No.: US 12,414,447 B2
(45) Date of Patent: Sep. 9, 2025

(54) DISPLAY DEVICE

(71) Applicant: Samsung Display Co., LTD., Yongin-si (KR)

(72) Inventors: Do Yeong Park, Yongin-si (KR); Kyung Bae Kim, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 332 days.

(21) Appl. No.: 17/519,417

(22) Filed: Nov. 4, 2021

(65) Prior Publication Data

US 2022/0157917 A1    May 19, 2022

(30) Foreign Application Priority Data

Nov. 17, 2020    (KR) .................. 10-2020-0154018

(51) Int. Cl.
*H10K 59/131*    (2023.01)
*H10K 59/121*    (2023.01)
*H10K 59/122*    (2023.01)

(52) U.S. Cl.
CPC ....... *H10K 59/131* (2023.02); *H10K 59/1213* (2023.02); *H10K 59/122* (2023.02)

(58) Field of Classification Search
CPC ............. H10K 59/131; H10K 59/1213; H10K 59/122; H01L 25/0753; H01L 25/167; H01L 27/1214; G09G 3/32
See application file for complete search history.

(56) References Cited

U.S. PATENT DOCUMENTS

| | | | |
|---|---|---|---|
| 10,249,603 B2 | 4/2019 | Cho et al. |
| 10,276,630 B2 | 4/2019 | Lee et al. |
| 10,340,419 B2 | 7/2019 | Kim et al. |
| 10,797,212 B2 | 10/2020 | Im et al. |
| 12,100,710 B2 | 9/2024 | Kang et al. |

(Continued)

FOREIGN PATENT DOCUMENTS

| | | |
|---|---|---|
| KR | 10-2005-0090586 A | 9/2005 |
| KR | 10-2018-0009014 A | 1/2018 |

(Continued)

OTHER PUBLICATIONS

International Search Report dated Feb. 9, 2022 for corresponding PCT Application No. PCT/KR2021/015128 (3 pages).

*Primary Examiner* — Bitew A Dinke
(74) *Attorney, Agent, or Firm* — Womble Bond Dickinson (US) LLP

(57) ABSTRACT

A display device includes a base layer including a display area and a non-display area; pixels in the display area, each of the pixels including a first electrode and a second electrode in a light emitting area and light emitting elements arranged therebetween; a bank in the display area and surrounding the light emitting area of each of the pixels; a first power line in the display area, a portion of the first power line overlapping the light emitting area of at least one pixel of the pixels; a second power line in the display area and covered by the bank; a first line in the non-display area and connected to the first power line; a second line in the non-display area and connected to the second power line; and a third line in the non-display area and separated from the pixels and the first and second power lines.

16 Claims, 17 Drawing Sheets

(56) References Cited

U.S. PATENT DOCUMENTS

| | | | |
|---|---|---|---|
| 2005/0200270 A1 | 9/2005 | Kwak et al. | |
| 2014/0191930 A1* | 7/2014 | Okumoto | G09G 3/006 345/55 |
| 2015/0255487 A1* | 9/2015 | Yoshida | H01L 27/1248 257/43 |
| 2017/0004784 A1* | 1/2017 | Cao | G09G 3/3677 |
| 2018/0033832 A1* | 2/2018 | Park | G06F 3/0412 |
| 2018/0061869 A1* | 3/2018 | Suzuki | G02F 1/134309 |
| 2018/0331171 A1* | 11/2018 | Kim | H10K 50/818 |
| 2019/0165312 A1* | 5/2019 | Bae | G09G 3/3225 |
| 2019/0326348 A1 | 10/2019 | Im et al. | |
| 2019/0348491 A1* | 11/2019 | Chung | H10K 50/8426 |
| 2020/0005703 A1* | 1/2020 | Kim | H10K 59/131 |
| 2020/0013766 A1* | 1/2020 | Kim | H01L 25/167 |
| 2020/0075667 A1* | 3/2020 | Lee | H01L 33/44 |
| 2020/0203587 A1* | 6/2020 | Kim | H01L 27/156 |
| 2020/0212356 A1* | 7/2020 | Kim | H10K 59/131 |
| 2020/0258938 A1* | 8/2020 | Chai | H01L 33/62 |
| 2020/0273397 A1* | 8/2020 | Jeong | H01L 33/62 |
| 2020/0312941 A1* | 10/2020 | Na | H10K 59/122 |
| 2021/0217739 A1* | 7/2021 | Lee | H01L 33/50 |
| 2022/0005979 A1* | 1/2022 | Kang | H01L 25/0753 |
| 2022/0037299 A1* | 2/2022 | Lee | H01L 25/167 |
| 2022/0158052 A1* | 5/2022 | Lee | G09G 3/32 |
| 2022/0158054 A1* | 5/2022 | Cha | H01L 27/156 |
| 2022/0328574 A1* | 10/2022 | Jiang | H01L 27/0292 |
| 2022/0352244 A1* | 11/2022 | Kang | H01L 33/38 |
| 2023/0148233 A1* | 5/2023 | Wei | H10K 59/131 257/40 |

FOREIGN PATENT DOCUMENTS

| | | | | |
|---|---|---|---|---|
| KR | 10-2018-0011404 A | 2/2018 | | |
| KR | 10-2019-0042130 A | 4/2019 | | |
| KR | 10-1987196 B1 | 6/2019 | | |
| KR | 10-2019-0121894 A | 10/2019 | | |
| KR | 10-2020-0001657 A | 1/2020 | | |
| KR | 10-2020-0027136 A | 3/2020 | | |
| KR | 10-2020-0062458 A | 6/2020 | | |
| KR | 10-2020-0073340 A | 6/2020 | | |
| KR | 10-2020-0098767 A | 8/2020 | | |
| KR | 10-2020-0102607 A | 9/2020 | | |
| KR | 10-2020-0105598 A | 9/2020 | | |
| WO | WO-2020050467 A1 * | 3/2020 | | H01L 25/0753 |
| WO | WO-2020060002 A1 * | 3/2020 | | H01L 25/0753 |
| WO | WO-2020111413 A1 * | 6/2020 | | H01L 25/0753 |
| WO | WO 2020/133161 A1 | 7/2020 | | |
| WO | WO-2020171323 A1 * | 8/2020 | | G09G 3/32 |

\* cited by examiner

FIG. 12
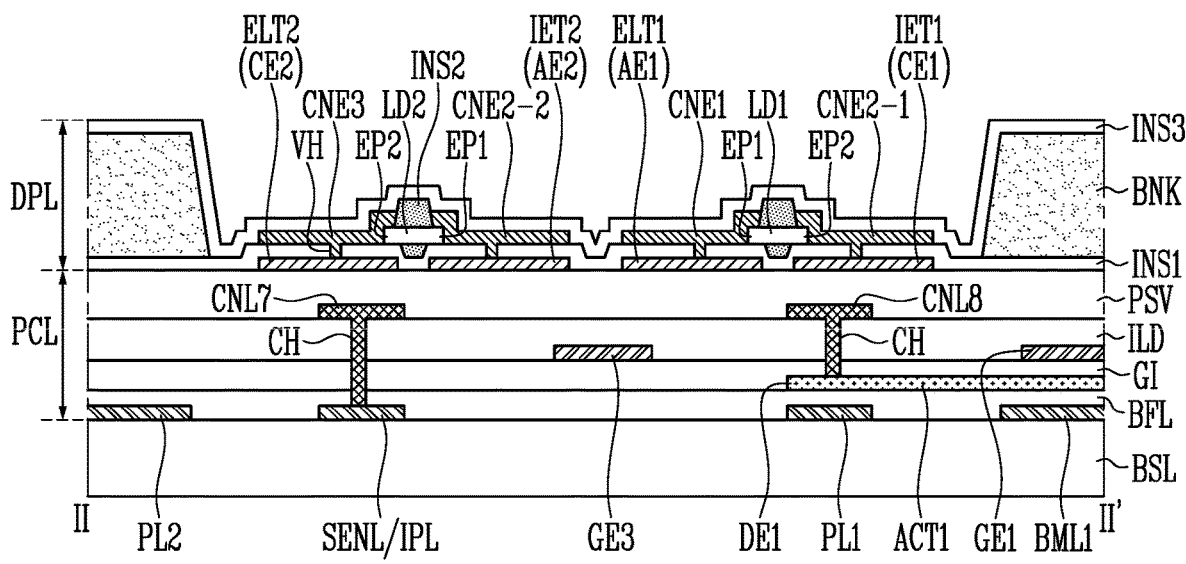
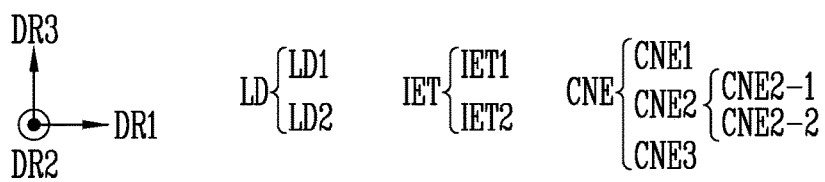

FIG. 13
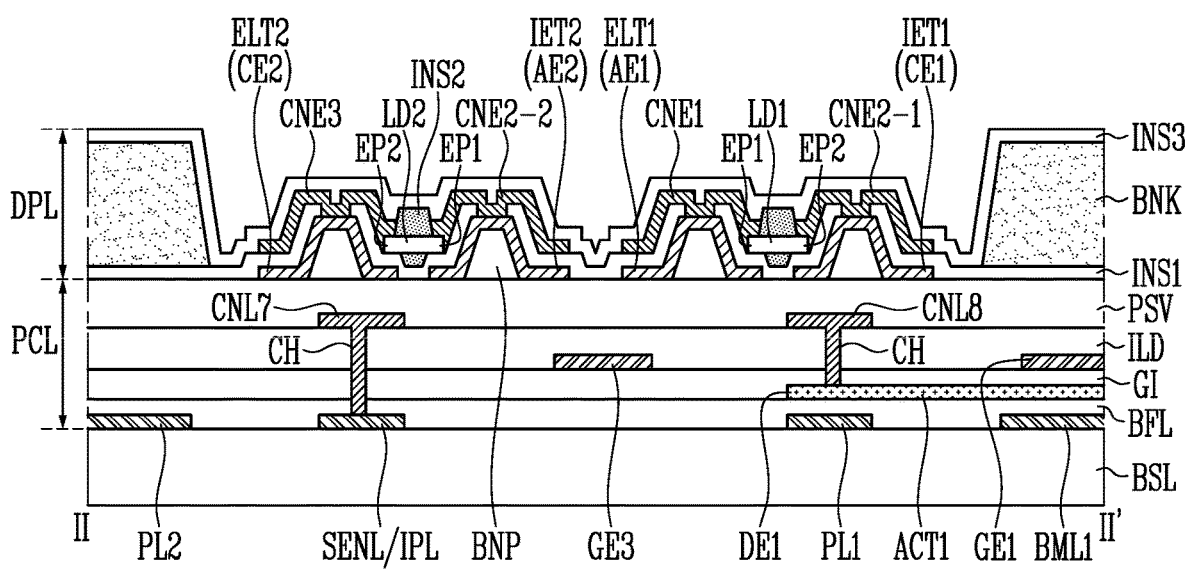
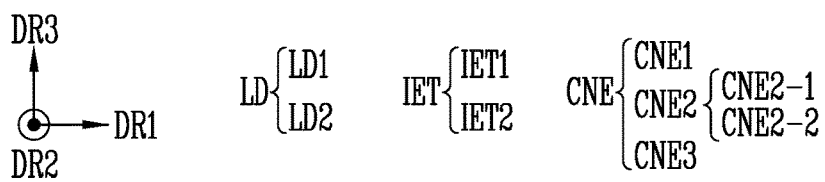

FIG. 14
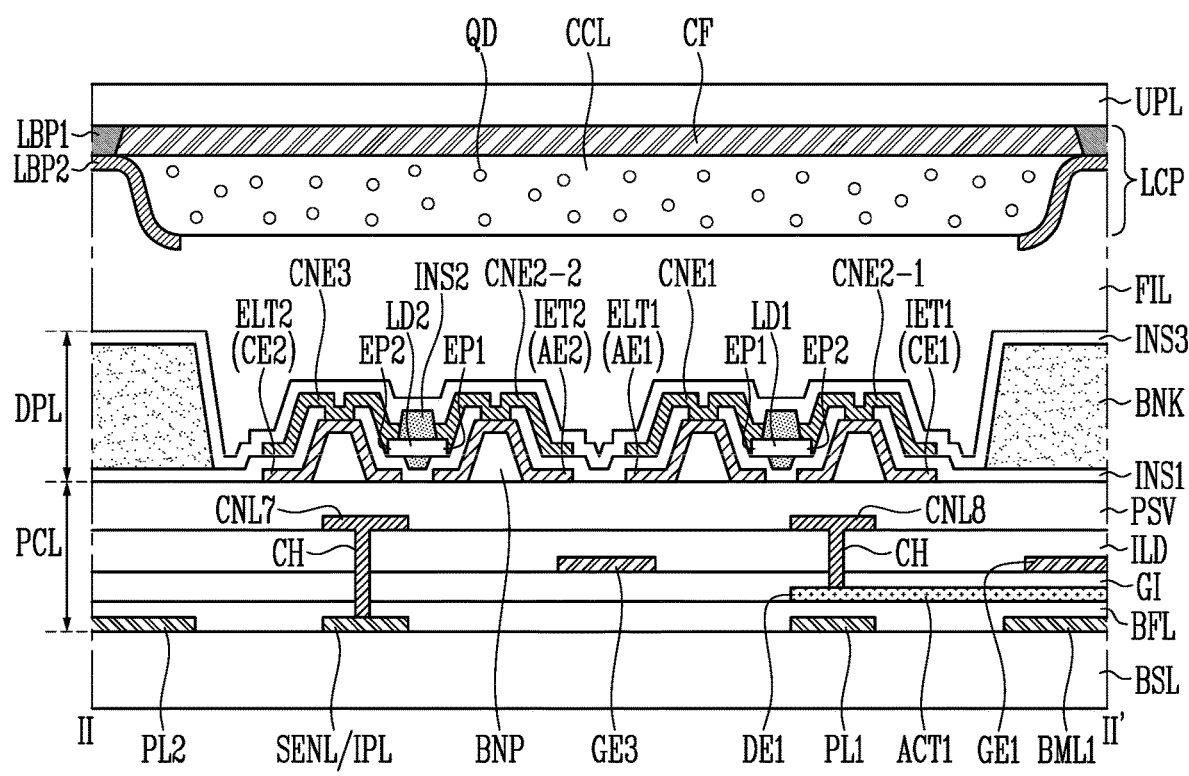
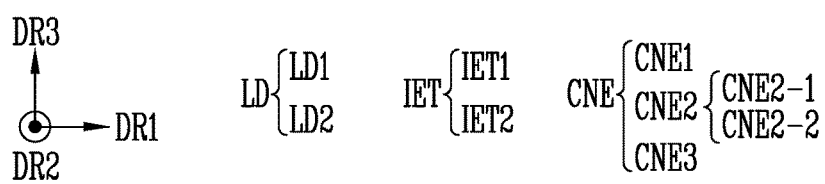

DISPLAY DEVICE

CROSS-REFERENCE TO RELATED APPLICATION

This application claims priority to and the benefit of Korean Patent Application No. 10-2020-0154018 filed in the Korean Intellectual Property Office on Nov. 17, 2020, the entire content of which is incorporated herein by reference.

BACKGROUND

1. Field

The present disclosure relates to a display device.

2. Description of the Related Art

Recently, an interest in information display has been increasing. Accordingly, research and development on display devices are continuously being conducted.

SUMMARY

The present disclosure provides a display device including a light emitting element.

Aspects of embodiments of the present disclosure are not limited to the aspects described above, and other technical aspects that are not described may be clearly understood by those skilled in the art from the following description.

An embodiment of the present disclosure may provide a display device including a base layer including a display area and a non-display area; pixels in the display area, each of the pixels including a first electrode and a second electrode located in a light emitting area and light emitting elements arranged between the first electrode and the second electrode; a bank in the display area and surrounding the light emitting area of each of the pixels; a first power line in the display area, a portion of the first power line overlapping the light emitting area of at least one of the pixels; a second power line in the display area and covered by the bank; a first line in the non-display area and connected to the first power line; a second line in the non-display area and connected to the second power line; and a third line in the non-display area and separated from the pixels, the first power line, and the second power line.

In an embodiment, the display device may further include first conductive patterns, each having one end connected to the third line and extending toward the first electrode of each of adjacent pixels from among the pixels; and second conductive patterns, each having one end connected to the second line and extending toward the second electrode of each of adjacent pixels from among the pixels.

In an embodiment, another end of each of the first conductive patterns and the second conductive patterns may be disconnected and floated in at least one open area around the adjacent pixels.

In an embodiment, the display device may further include a pad portion in the non-display area, and the pad portion may include a first pad connected to the first line, a second pad connected to the second line, and a third pad connected to the third line.

In an embodiment, the first pad may receive first power supply voltage, and the second pad and the third pad may receive a second power supply voltage.

In an embodiment, the first power supply voltage may be a high-potential pixel power supply voltage, and the second power supply voltage may be a low-potential pixel power supply voltage.

In an embodiment, each of the first, second, and third lines may include a first portion between the display area and the pad portion, and a second portion facing the first portion with the display area interposed therebetween.

In an embodiment, respective ends of the first power line may be connected to the first portion and the second portion of the first line, and respective ends of the second power line may be connected to the first portion and the second portion of the second line.

In an embodiment, each of the first, second, and third lines may include a third portion located on one side of the display area and connecting the first portion and the second portion of a corresponding one of the first, second, and third lines, and a fourth portion that faces the third portion with the display area interposed therebetween and connects the first portion to the second portion of a corresponding one of the first, second, and third lines.

In an embodiment, at least one of the first, second, and third lines may have a shape of a closed loop surrounding the display area.

In an embodiment, the pixels may include first color pixels, second color pixels, and third color pixels, and the display area may include a pixel unit including one of the first color pixels, one of the second color pixels, and one of the third color pixels arranged adjacent to each other in one unit pixel area.

In an embodiment, the pixel unit may include a light emitting element layer including a first light emitting area, a second light emitting area, and a third light emitting area sequentially arranged in the unit pixel area along a first direction; and a pixel circuit layer overlapping the light emitting element layer and including a first pixel circuit area, a second pixel circuit area, and a third pixel circuit area sequentially arranged in the unit pixel area along a second direction crossing the first direction.

In an embodiment, the first power line may overlap at least one of the first, second, and third light emitting areas, and the second power line may be located on at least one side of the unit pixel area so as not to overlap the first, second, and third light emitting areas.

In an embodiment, the bank may have a first width in the first direction in first non-light emitting areas between the first, second, and third light emitting areas in the unit pixel area, and have a second width greater than the first width in the first direction in second non-light emitting areas on both sides of the unit pixel area.

In an embodiment, the second power line may be located in the second non-light emitting areas, and an upper surface of the second power line may be completely covered by the bank.

In an embodiment, each of the pixels may further include an intermediate electrode connected between the first electrode and the second electrode.

In an embodiment, the light emitting elements may include at least one first light emitting element connected between the first electrode and the intermediate electrode and including a first end portion and a second end portion, and at least one second light emitting element connected between the intermediate electrode and the second electrode and including a first end portion and a second end portion.

In an embodiment, each of the pixels may further include a first contact electrode on the first electrode and the first end portion of the first light emitting element, a second contact electrode on the intermediate electrode, the second end portion of the first light emitting element, and the first end portion of the second light emitting element, and a third contact electrode on the second electrode and the second end portion of the second light emitting element.

In an embodiment, the intermediate electrode may include a first intermediate electrode and a second intermediate electrode that are spaced from each other, wherein the first electrode is interposed between the first intermediate electrode and the second intermediate electrode, and the first intermediate electrode and the second intermediate electrode may be connected to each other through the second contact electrode.

In an embodiment, at least one of the first electrode and the second electrode may be disconnected in at least one open area around the light emitting area of each of the pixels.

Details of other embodiments are included in the detailed description and drawings.

According to embodiments of the present disclosure, a utilization rate of light emitting elements supplied to each light emitting area may be increased by stably aligning the light emitting elements in the light emitting area of each pixel. In addition, alignment characteristics of the light emitting elements may be prevented from being degraded without covering a first power line by a bank, and thus, areas of the light emitting areas may be prevented from being limited by the first power line. Accordingly, a sufficient number of light emitting elements may be supplied to and aligned in each light emitting area, and light emission characteristics of the pixels may be improved.

Aspects of embodiments of the present disclosure are not limited to the content described above, and more various aspects are included in the present disclosure.

BRIEF DESCRIPTION OF THE DRAWINGS

The above and other aspects and features of certain embodiments of the present disclosure will be more apparent from the following description taken in conjunction with the accompanying drawings, in which:

FIGS. 12 and 13 illustrate different embodiments of cross sections taken along the lines II-II' of FIGS. 10 and 11, respectively;

FIG. 14 is a cross-sectional view illustrating a display device according to an embodiment of the present disclosure;

DETAILED DESCRIPTION

Figure 1:
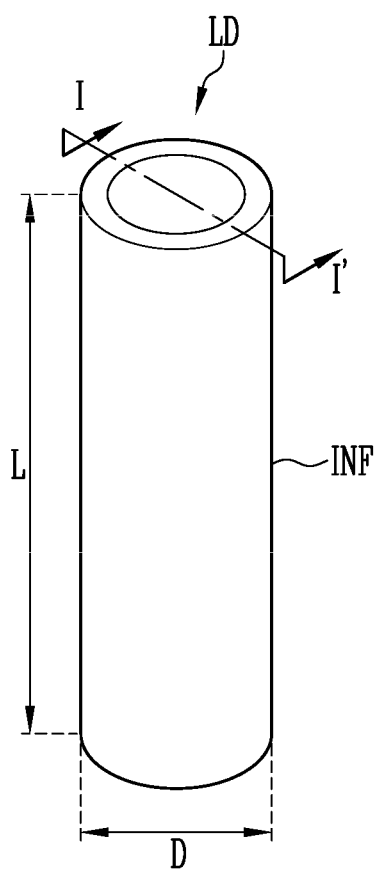
FIG. 1 is a perspective view illustrating a light emitting element according to an embodiment of the present disclosure.

The present disclosure may be variously modified and may have various forms, and some embodiments will be illustrated in the drawings and described in detail in the present disclosure. In the following description, singular expressions include plural expressions unless the context clearly indicates that only the singular expressions are included.

The present disclosure is not limited to the embodiments to be disclosed below and may be implemented in various forms. In addition, the respective embodiments to be disclosed below may be implemented alone or may be implemented in combination with at least one other embodiment.

In the drawings, some components that are not directly related to the characteristics of the present disclosure may be omitted to clearly illustrate features and/or aspects of the present disclosure. The same or similar components throughout the drawings may be denoted by the same reference numerals and symbols as much as possible, even though the components may be displayed on different drawings, and redundant descriptions may not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Figure 2:
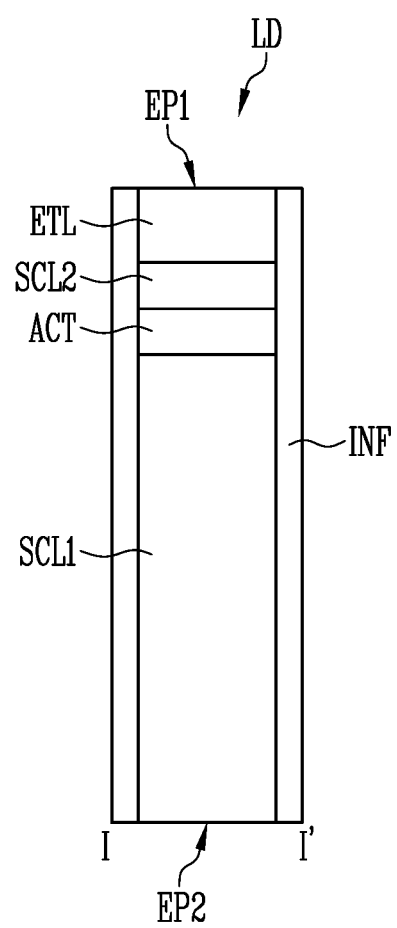
FIG. 2 is a cross-sectional view illustrating a light emitting element according to an embodiment of the present disclosure.

FIG. 1 is a perspective view illustrating a light emitting element LD according to an embodiment of the present disclosure, and FIG. 2 is a cross-sectional view illustrating the light emitting element LD according to the embodiment of the present disclosure. For example, FIG. 1 illustrates an example of the light emitting element LD that may be used as a light source of a pixel according to an embodiment of the present disclosure, and FIG. 2 illustrates an example of a cross section of the light emitting element LD taken along the line I-I' of FIG. 1.

Referring to FIGS. 1 and 2, the light emitting element LD includes a first semiconductor layer SCL1, an active layer ACT, and a second semiconductor layer SCL2 that are sequentially arranged in one direction, and includes an insulating film INF surrounding outer surfaces (for example, outer circumferential surfaces or outer peripheral surfaces or side surfaces) of the first semiconductor layer SCL1, the active layer ACT, and the second semiconductor layer SCL2. In addition, the light emitting element LD may selectively further include an electrode layer ETL arranged on the second semiconductor layer SCL2. In this case, the insulating film INF may or may not at least partially cover the outer surface (e.g., the outer peripheral surface) of the electrode layer ETL.

In an embodiment, the light emitting element LD may have a rod shape extending in one direction and may have a first end portion EP1 and a second end portion EP2 at respective ends in a length L direction (or a thickness direction) of the light emitting element LD. The first end portion EP1 may be a first bottom (or upper surface) of the light emitting element LD, and the second end portion EP2 may be a second bottom (or bottom surface) of the light emitting element LD.

In describing the embodiments of the present disclosure, the rod shape refers to a rod-like shape or a bar-like shape which is long (that is, an aspect ratio is greater than 1) in the length L direction, such as a circular column or a polygonal column, and a shape of a cross section thereof is not limited in particular. For example, the length L of the light emitting element LD may be greater than a diameter D (or a width of the cross section).

The first semiconductor layer SCL1, the active layer ACT, the second semiconductor layer SCL2, and the electrode layer ETL may be sequentially arranged along a direction from the second end portion EP2 to the first end portion EP1 of the light emitting element LD. That is, the first semiconductor layer SCL1 may be arranged at the second end portion EP2 of the light emitting element LD, and the electrode layer ETL may be arranged at the first end portion EP1 of the light emitting element LD.

The first semiconductor layer SCL1 may be a first conductivity type semiconductor layer. For example, the first semiconductor layer SCL1 may be an N-type semiconductor layer including an N-type dopant. For example, the first semiconductor layer SCL1 may include any one of InAlGaN, GaN, AlGaN, InGaN, AlN, and InN and may be an N-type semiconductor layer doped with an N-type dopant such as Si, Ge, and Sn. However, the material forming the first semiconductor layer SCL1 is not limited thereto, and the first semiconductor layer SCL1 may be formed of any one of various other suitable materials.

The active layer ACT may be arranged on the first semiconductor layer SCL1 and may be formed in a single-quantum well structure or a multi-quantum well structure. A position of the active layer ACT may be variously changed depending on the type of the light emitting element LD. The active layer ACT may emit light with a wavelength of 400 nm to 900 nm and may have a double hetero-structure.

A clad layer doped with a conductive dopant may be selectively formed on and/or under the active layer ACT. For example, the clad layer may be formed of an AlGaN layer or an InAlGaN layer. In some embodiments, materials such as AlGaN and AlInGaN may be used to form the active layer ACT, and various other materials may form the active layer ACT.

When a voltage higher than or equal to a threshold voltage is applied to both ends of the light emitting element LD, electrons and holes are coupled to each other in the active layer ACT to cause the light emitting element LD to emit light. By controlling the light emission of the light emitting element LD by using this principle, the light emitting element LD may be used as a light source for various light emitting devices including pixels of a display device.

The second semiconductor layer SCL2 may be arranged on the active layer ACT and may be a second conductivity type semiconductor layer different from the first semiconductor layer SCL1. For example, the second semiconductor layer SCL2 may include a P-type semiconductor layer including a P-type dopant. For example, the second semiconductor layer SCL2 may include at least one semiconductor material of InAlGaN, GaN, AlGaN, InGaN, AlN, and InN and may be a P-type semiconductor layer doped with a P-type dopant such as Mg. However, a material forming the second semiconductor layer SCL2 is not limited thereto, and various other materials may form the second semiconductor layer SCL2.

In an embodiment, the first semiconductor layer SCL1 and the second semiconductor layer SCL2 may have different lengths (or thicknesses) in the length L direction of the light emitting element LD. For example, the first semiconductor layer SCL1 may be longer (or have a greater thickness) than the second semiconductor layer SCL2 in the length L direction of the light emitting element LD. Accordingly, the active layer ACT of the light emitting element LD may be closer to the first end portion EP1 than the second end portion EP2.

The electrode layer ETL is arranged on the second semiconductor layer SCL2. The electrode layer ETL may protect the second semiconductor layer SCL2 and may be a contact electrode for smoothly connecting the second semiconductor layer SCL2 to an electrode (e.g., a predetermined electrode) or a line. For example, the electrode layer ETL may be an ohmic contact electrode or a Schottky contact electrode.

In describing the embodiments of the present disclosure, a term "connection (or coupling)" may mean a physical and/or electrical connection (or coupling) in generical. In addition, the connection may mean a direct or indirect connection (or coupling) and an integral or non-integral connection (or coupling) in generical.

The electrode layer ETL may be substantially transparent or translucent. Accordingly, light generated by the light emitting element LD may be emitted to the outside of the light emitting element LD by passing through the electrode layer ETL. In another embodiment, when the light generated by the light emitting element LD is emitted to the outside of the light emitting element LD through an area (or portion) other than one end portion of the light emitting element LD in which the electrode layer ETL is arranged without passing through the electrode layer ETL, the electrode layer ETL may be formed to be opaque.

In an embodiment, the electrode layer ETL may include a metal or a metal oxide. For example, the electrode layer ETL may be formed of a metal such as chromium (Cr), titanium (Ti), aluminum (Al), gold (Au), nickel (Ni), or copper (Cu), may be formed of oxides or alloys thereof, or may be formed of one or an alloy of transparent conductive materials such as indium tin oxide (ITO), indium zinc oxide (IZO), indium tin zinc oxide (ITZO), zinc oxide (ZnO), and indium oxide (In2O3).

The insulating film INF may expose the electrode layer ETL and the first semiconductor layer SCL1 at the first and second end portions EP1 and EP2 of the light emitting element LD, respectively.

In case that the insulating film INF is provided to cover outer surfaces (e.g., outer circumferential surfaces or outer peripheral surfaces) of the first semiconductor layer SCL1, the active layer ACT, the second semiconductor layer SCL2, and/or the electrode layer ETL, a short defect (or a short circuit defect) through the light emitting element LD may be prevented from being generated. Accordingly, electrical stability of the light emitting element LD may be obtained.

In case that the insulating film INF is provided on a surface of the light emitting element LD, a surface defect of the light emitting element LD may be reduced or minimized to increase lifespan and efficiency thereof. In addition, when the insulating film INF is formed on each light emitting element LD, an unwanted short circuit between the light emitting elements LD may be prevented from occurring even when a plurality of light emitting elements LD are arranged in close contact with each other.

In an embodiment of the present disclosure, the light emitting element LD may be manufactured through a surface treatment process. For example, when multiple light emitting elements LD are mixed with a fluid solution (or a solvent) and supplied to each light emitting area (for example, a light emitting area of each pixel), the light emitting elements LD may be surface-treated to be uniformly dispersed without uneven aggregation in the solution. As a non-limiting example in this regard, the insulating film INF may be formed as a hydrophobic film by using a hydrophobic material, or a hydrophobic film formed of a hydrophobic material may be additionally formed on the insulating film INF.

The insulating film INF may include a transparent insulating material. Accordingly, light generated by the active layer ACT may be emitted to the outside of the light emitting element LD by passing through the insulating film INF. For example, the insulating film INF may include at least one insulating material from among SiO2 or silicon oxide (SiOx) undetermined thereas, Si3N4 or silicon nitride (SiNx) undetermined thereas, Al2O3 or aluminum oxide (AlxOy) undetermined thereas, and TiO2 or titanium oxide (TixOy) undetermined thereas but is not limited thereto.

In an embodiment, the light emitting element LD may have a size as small as in a range between nanoscale to microscale. For example, the light emitting element LD may have a diameter D (or a width of a transverse section) and/or a length L in a range from nanoscale to microscale. For example, the light emitting element LD may have the diameter D in a range of several hundred nanometers and the length L in a range of several micrometers. However, a size of the light emitting element LD in the present disclosure is not limited thereto. For example, the size of the light emitting element LD may be variously changed depending on design conditions of various light emitting devices that use the light emitting element LD as a light source.

In addition, a structure, a shape, and/or a type of the light emitting element LD may be changed depending on embodiments. For example, the light emitting element LD may not include the electrode layer ETL. In addition, the light emitting element LD may also further include another electrode layer arranged at one end portion (e.g., EP2) of the first semiconductor layer SCL1. In addition, the light emitting element LD may also be formed in a core-shell structure.

A light emitting device including the light emitting element LD may be used for various types of devices requiring a light source in addition to a display device. For example, a plurality of light emitting elements LD may be arranged in each pixel of a display panel, and the light emitting elements LD may be used as a light source of each pixel. However, an application field of the light emitting element LD is not limited to the example described above. For example, the light emitting element LD may be used for other types of devices requiring a light source, such as an illumination device.

Figure 3:
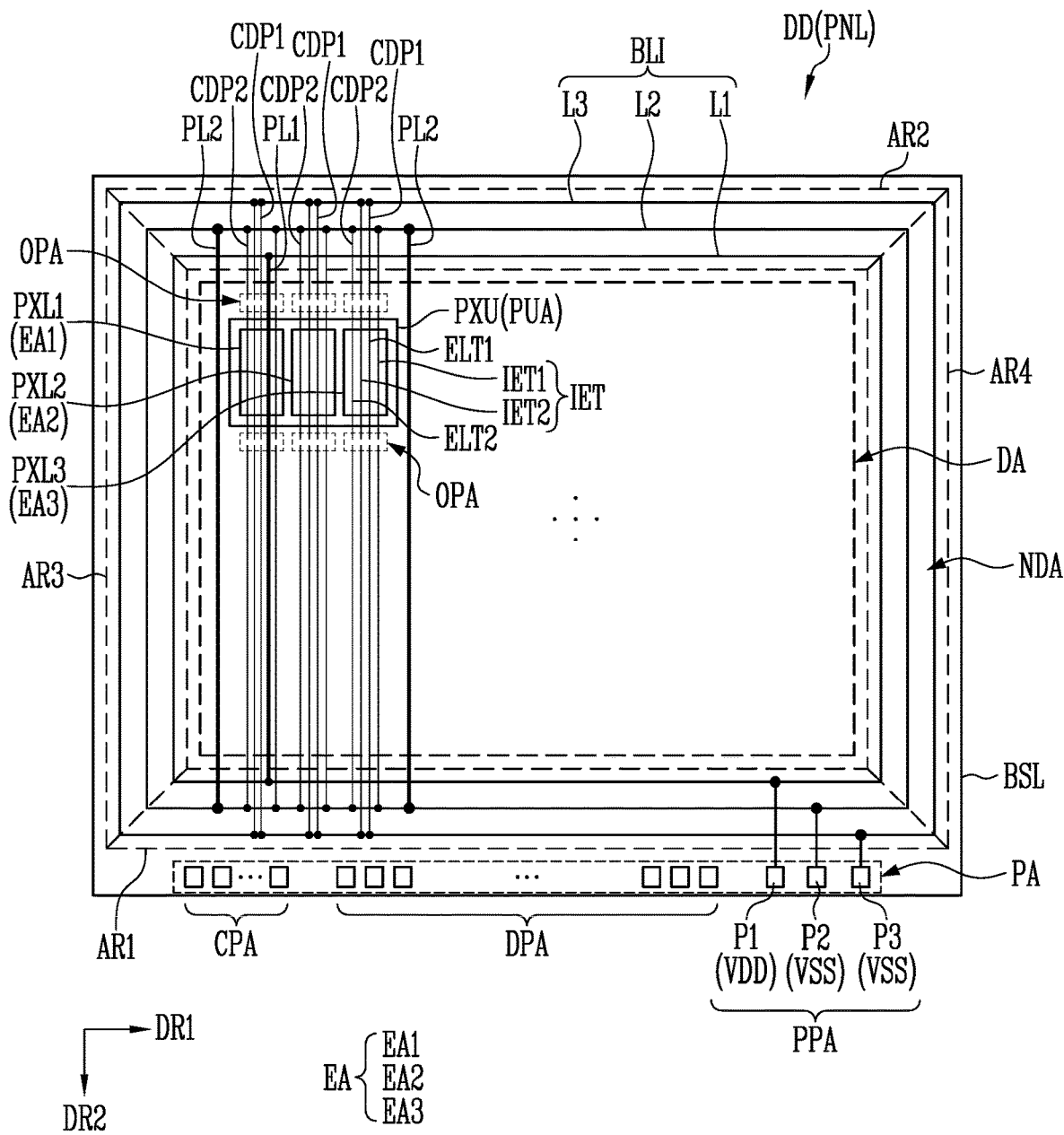
FIG. 3 is a plan view illustrating a display device according to an embodiment of the present disclosure.

FIG. 3 is a plan view illustrating a display device DD according to an embodiment of the present disclosure. FIG. 3 illustrates the display device DD that is an example of an electronic device that may use the light emitting element LD described in the embodiments of FIGS. 1 and 2 as a light source, and illustrates a display panel PNL provided in the display device DD. For example, each pixel unit PXU of the display panel PNL and each of a plurality of pixels constituting the pixel unit may include at least one light emitting element LD.

For the sake of convenience, FIG. 3 briefly illustrates a structure of the display panel PNL centering around a display area DA and bus lines BLI arranged around the display area DA. However, in some embodiments, at least one drive circuit unit and so on, that are not illustrated, may be further arranged on the display panel PNL.

Referring to FIGS. 1-3, the display panel PNL according to an embodiment of the present disclosure may include a base layer BSL and pixels arranged on the base layer BSL. The pixels may include first color pixels PXL1, second color pixels PXL2, and/or third color pixels PXL3. Hereinafter, one or more pixels of the first color pixels PXL1, the second color pixels PXL2, and the third color pixels PXL3 may be randomly referred to as a "pixel PXL" or "pixels PXL", or two or more types of pixels may be collectively referred to as "pixels PXL".

The display panel PNL and the base layer BSL for forming the same may include the display area DA for displaying an image and a non-display area NDA other than the display area DA.

The display area DA may be arranged in a central area of the display panel PNL, and the non-display area NDA may be arranged in an edge area of the display panel PNL so as to surround the display area DA along the edge or periphery of the display area DA. However, positions of the display area DA and the non-display area NDA may be changed. The display area DA may constitute a screen on which an image is displayed, and the non-display area NDA may be an area other than the display area DA.

The base layer BSL constitutes a base member of the display panel PNL and may be a rigid or flexible substrate or film. For example, the base layer BSL may be a rigid substrate formed of glass or tempered glass, a flexible substrate (or a thin film) formed of plastic or metal, or an insulating film of at least one layer. A material and/or physical properties of the base layer BSL are not limited in particular.

One area on the base layer BSL may be defined as the display area DA so that the pixels PXL are arranged therein, and the other area may be defined as the non-display area NDA. For example, the base layer BSL includes the display area DA including a plurality of pixel areas in which respective pixels PXL are arranged, and the non-display area NDA located at an outer edge of the display area DA.

The pixels PXL may be provided in the display area DA. For example, the pixels PXL may be regularly arranged according to a stripe or a PENTILE® arrangement structure and so on in the display area DA, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PX is not limited thereto, and the pixels PX may be arranged in the display area DA in various structures and/or manners.

The pixel PXL may include at least one light source that is driven by a suitable control signal (e.g., a set or predetermined control signal) (for example, a scan signal and a data signal) and/or a suitable power supply (e.g., a set or predetermined power supply) (for example, a first power supply and a second power supply). In an embodiment, the light source may include at least one light emitting element LD according to the embodiment of FIGS. 1 and 2, for example, at least one rod-type light emitting element LD having a size as small as in a range from nanoscale to microscale. In addition, various types of light emitting elements may be used as a light source of the pixel PXL. For example, in another embodiment, a light source of each pixel PXL may also be constituted by a light emitting element having a core-shell structure.

In an embodiment, the pixel PXL may be constituted by an active pixel but is not limited thereto. For example, the pixel PXL may be constituted by a passive or active light emitting display device having various structures and/or driving methods.

The pixel PXL may include a light emitting area EA, and at least one pair of electrodes spaced from each other may be arranged in the light emitting area EA. For example, a first electrode ELT1 and a second electrode ELT2 may be arranged to be spaced from each other in a first direction DR1 and extend in a second direction DR2, and at least one light emitting element, for example, a plurality of light emitting elements LD may be arranged between the first electrode ELT1 and the second electrode ELT2. In an embodiment, the first direction DR1 may be a horizontal direction (or a row direction), and the second direction DR2 may be a vertical direction (or a column direction), but the present disclosure is not limited thereto.

At least one intermediate electrode IET may be selectively further arranged in the light emitting area EA. For example, a first intermediate electrode IET1 adjacent to the first electrode ELT1 may be arranged in the light emitting area EA, and a second intermediate electrode IET2 adjacent to the second electrode ELT2 may be arranged in the light emitting area EA. In this case, some of the light emitting elements LD may be arranged between the first electrode ELT1 and the first intermediate electrode IET1, and some of the light emitting elements LD may be arranged between the second intermediate electrode IET2 and the second electrode ELT2. In an embodiment, the first intermediate electrode IET1 and the second intermediate electrode IET2 may be integrally or non-integrally connected to each other, and in this case, the first intermediate electrode IET1 and the second intermediate electrode IET2 may be electrically configured as one intermediate electrode IET.

One or more open areas OPA (also referred to as an "electrode isolation (or disconnection) area") may be arranged around the pixels PXL. For example, the isolation areas OPA may be arranged on both sides of the pixel PXL in the second direction DR2. At least one of the first electrode ELT1, the second electrode ELT2, and the intermediate electrode IET may be separated from at least one of the first electrode ELT1, the second electrode ELT2, and the intermediate electrode IET of another pixel PXL in each of the isolation areas OPA.

The pixel PXL may have a structure according to at least one of the embodiments to be described below. For example, the pixel PXL may have a structure to which at least one of the embodiments to be described below is applied. Detailed description related to the structure of the pixel PXL will be made below.

In some embodiments, at least two types of pixels PXL that emit light of different colors may be arranged in the display area DA. For example, the first color pixels PXL1 that emit light of a first color, the second color pixels PXL2 that emit light of a second color, and the third color pixels PXL3 that emit light of a third color may be arranged in the display area DA. In addition, at least one of the first color pixels PXL1, at least one of the second color pixels PXL2, and at least one of the third color pixels PXL3, that are arranged adjacent to each other in any one unit pixel area PUA may configure one pixel unit PXU that emit light of various colors.

In some embodiments, the first color pixel PXL1 may be a red pixel that emits red light, and the second color pixel PXL2 may be a green pixel that emits green light. In addition, the third color pixel PXL3 may be a blue pixel that emits blue light.

In an embodiment, the first color pixel PXL1, the second color pixel PXL2, and the third color pixel PXL3 may have a first color light emitting element, a second color light emitting element, and a third color light emitting element respectively, thereby emitting light of a first color, light of a second color, and light of a third color, respectively. For example, at least one first color light emitting element (for example, red light emitting element) may be arranged in a light emitting area (hereinafter, referred to as a "first light emitting area EA1") of the first color pixel PXL1, at least one second color light emitting element (for example, green light emitting element) may be arranged in a light emitting area (hereinafter, referred to as a "second light emitting area EA2") of the second color pixel PXL2, and at least one third color light emitting element (for example, blue light emitting element) may be arranged in a light emitting area (hereinafter, referred to as a "third light emitting area EA3") of the third color pixel PXL3.

In another embodiment, the first color pixel PXL1, the second color pixel PXL2, and the third color pixel PXL3 may include light emitting elements of the same color and may include light conversion layers and/or color filters of different colors arranged on the respective light emitting areas EA, thereby emitting a first color, a second color, and a third color, respectively.

In another embodiment, even when at least one of the first color pixel PXL1, the second color pixel PXL2, and the third color pixel PXL3 includes a light emitting element corresponding to a color of the corresponding pixel PXL, a light conversion layer may be arranged on the light emitting area EA of the pixel PXL.

However, the color, the type, and/or the number of pixels PXL constituting each pixel unit PXU are not limited in particular. For example, a color of light emitted by each pixel PXL may be variously changed.

In addition, power lines for supplying drive power supply voltages (e.g., set or predetermined drive power supply voltages) to the pixels PXL may be provided in the display area DA. For example, a first power line PL1 and a second power line PL2 may be arranged in the display area DA.

Each of the first power line PL1 and the second power line PL2 may extend in at least the second direction DR2. In addition, a plurality of the first power lines PL1 and a plurality of the second power lines PL2 may be arranged in the display area DA at intervals of at least one pixel unit PXU in the first direction DR1. For example, a distance between two adjacent first power lines PL1 may be at least one pixel unit PXU and a distance between two adjacent second power lines PL2 may be at least one pixel unit PXU.

For example, the respective first power lines PL1 may extend in the second direction DR2 to be commonly connected to the plurality of pixel units PXU sequentially arranged along the second direction DR2. Similarly, the respective second power lines PL2 may extend in the second direction DR2 to be commonly connected to the plurality of pixel units PXU sequentially arranged along the second direction DR2.

In an embodiment of the present disclosure, one area of the first power line PL1 may overlap the light emitting area EA of at least one pixel PXL. For example, the first power line PL1 may overlap the first light emitting areas EA1 of the plurality of first color pixels PXL1 arranged along the second direction DR2.

The first power line PL1 may be connected to a first line L1 (also referred to as a "first bus line") arranged in the non-display area NDA and may be connected to a first pad P1 of a pad portion PA. When the display device DD is driven, a first power supply voltage VDD (for example, a pixel power supply voltage of a high potential) may be supplied to the first pad P1.

In an embodiment, both ends of the first power line PL1 may be connected to first and second areas AR1 and AR2 of the first line L1. In this case, the first power line PL1 may receive the first power supply voltage VDD in both directions while the display device DD is driven. Accordingly, a voltage drop of the first power supply voltage VDD may be reduced or minimized.

The second power line PL2 may be arranged so as not to overlap the light emitting areas EA of the pixels PXL. For example, the second power line PL2 may be arranged on at least one side of each pixel unit PXL. For example, the second power line PL2 may be arranged on both sides of the pixel units PXU with the pixel units PXU that are arranged in the second direction DR2 and interposed therebetween.

The second power line PL2 may be connected to a second line L2 (also referred to as a "second bus line") arranged in the non-display area NDA and may be connected to a second pad P2 of the pad portion PA. When the display device DD is driven, a second power supply voltage VSS (for example, a pixel power supply voltage of a low potential) may be supplied to the second pad P2.

In an embodiment, both ends of the second power line PL2 may be connected to the first and the second areas AR1 and AR2 of the second line L2. In this case, the second power line PL2 may receive the second power supply voltage VSS in both directions while the display device DD is driven. Accordingly, a voltage drop of the second power supply voltage VSS may be reduced or minimized.

Various lines, pads, and/or embedded circuit units connected to the pixels PXL of the display area DA may be provided in the non-display area NDA. For example, bus lines BLI and the pad portion PA may be provided in the non-display area NDA.

The bus lines BLI may be arranged on at least one side of the display area DA and may surround at least one area of the display area DA. In an embodiment of the present disclosure, the bus lines BLI may include a first line L1, a second line L2, and a third line L3.

The first line L1 may be connected to the first power line PL1 and the first pad P1. For example, the first line L1 may be connected between the first power line PL1 and the first pad P1 to transmit the first power supply voltage VDD, which is applied to the first pad P1 when the display device DD is driven, to the first power line PL1.

The second line L2 may be connected to the second power line PL2 and the second pad P2. For example, the second line L2 may be connected between the second power line PL2 and the second pad P2 to transmit the second power supply voltage VSS, which is applied to the second pad P2 when the display device DD is driven, to the second power line PL2.

In addition, the second line L2 may be connected to a second alignment pad provided on a mother board to transmit a second alignment signal applied to the second alignment pad to the second electrodes ELT2 and/or the first intermediate electrodes IET1 of the pixels PXL during a step of manufacturing the display device DD, for example, during a step of aligning the light emitting elements LD in each light emitting area EA. To this end, the second line L2 may be first formed to be integrally or non-integrally connected to the second electrodes ELT2 and/or the first intermediate electrodes IET1 of the pixels PXL and may be separated from the second electrodes ELT2 and/or the first intermediate electrodes IET1 of the pixels PXL after alignment of the light emitting elements LDs is completed. During this process, second conductive patterns CDP2 may be formed.

One end of each of the second conductive patterns CDP2 may be connected to the second line L2 and each of the second conductive patterns CDP2 may extend to the second electrodes ELT2 or the first intermediate electrodes IET1 of adjacent pixels PXL (for example, the pixels PXL of the first pixel row and/or the last pixel row). The other end of each of the second conductive patterns CDP2 may be disconnected and floated in at least one open area OPA located around the adjacent pixels PXL.

The third line L3 may not be connected to the pixels PXL and the first and second power lines PL1 and PL2. That is, the third line L3 may be separated from the pixels PXL and the first and second power lines PL1 and PL2.

In an embodiment, the third line L3 may be connected to a third pad P3 to receive the second power supply voltage VSS applied to the third pad P3 when the display device DD is driven. However, the present disclosure is not limited thereto. For example, in another embodiment, the third line L3 may receive the first power supply voltage VDD through the third pad P3 or may receive a third power supply voltage of a level different from levels of the first and second power supply voltages VDD and VSS. In another embodiment, the third line L3 may not be connected to the pad portion PA and may be floated.

In addition, the third line L3 may be connected to a first alignment pad provided on a mother board to transmit a first alignment signal applied to the first alignment pad to the first electrodes ELT1 and/or the second intermediate electrodes IET2 of the pixels PXL during a step of manufacturing the display device DD, e.g., during a step of aligning the light emitting elements LD in each light emitting area EA. To this end, the third line L3 may be first formed to be integrally or non-integrally connected to the first electrodes ELT1 and/or the second intermediate electrodes IET2 of the pixels PXL and may be separated from the first electrodes ELT1 and/or the second intermediate electrodes IET2 of the pixels PXL after alignment of the light emitting elements LDs is completed. During this process, first conductive patterns CDP1 may be formed.

One end of each of the first conductive patterns CDP1 may be connected to the third line L3 and may extend to the first electrodes ELT1 or the second intermediate electrodes IET2 of adjacent pixels PXL (for example, the pixels PXL of the first pixel row and/or the last pixel row). The other end of each of the first conductive patterns CDP1 may be disconnected and floated in at least one open area OPA located around the adjacent pixels PXL.

In an embodiment, the third line L3 may be arranged on the outermost side of the bus lines BLI. For example, the third line L3 may be arranged in an edge area of the display panel PNL to surround at least one area of the display area DA and the first and second lines L1 and L2. In this case, the third line L3 may also form a guard-ring (or shield line) in the display device DD.

In some embodiments, at least one of the first, second, and third lines L1, L2, and L3 may have a closed loop (or closed curve) shape. For example, each of the first, second, and third lines L1, L2, and L3 may have a closed loop (or closed curve) shape surrounding all surfaces of the display area DA. For example, each of the first, second, and third lines L1, L2, and L3 may have the first area (or first portion) AR1 (for example, lower area) between the display area DA and the pad portion PA, the second area (or second portion) AR2 (for example, upper area) facing (or opposite) the first area AR1 with the display area DA interposed therebetween, and a third area (or third portion) AR3 (for example, left area) that is arranged on one side of the display area DA and connects the first area AR1 to the second area AR2, and a fourth area (or fourth portion) AR4 (for example, right area) that faces (or opposite) the third area AR3 with the display area DA interposed therebetween and connects the first area AR1 to the second area AR2.

In case that the first and second lines L1 and L2 have a closed loop shape, voltage drops of the first and second power supply voltages VDD and VSS may be reduced or minimized. In addition, the first and second power lines VDD and VSS may be supplied in both directions by connecting the first and second lines L1 and L2 to both ends of the first and second power lines PL1 and PL2, respectively. Accordingly, a luminance deviation of the pixels PXL due to voltage drops of the first and second power sources VDD and VSS may be prevented or reduced.

In addition, in case that the second line L2 has a closed loop shape, the second alignment signal may be stably applied to the second electrode ELT2 and/or the intermediate electrodes IET of the pixels PXL during a step of manufacturing the display device DD, particularly during a step of aligning the light emitting elements LD in each light emitting area EA.

In case that the third line L3 has a closed loop shape, the pixels PXL and the first and second lines L1 and L2 may be effectively protected from static electricity.

The pad portion PA may be arranged in one area of the non-display area NDA and may include multiple pads for supplying (or transmitting) drive power supply voltages and signals for driving the pixels PXL and/or an embedded circuit unit provided in the display panel PNL. For example, the pad portion PA may include control pads CPA for transmitting control signals, data pads DPA for transmitting data signals (or image data), and power pads PPA for transmitting the drive power supply voltages.

In an embodiment of the present disclosure, the power pads PPA may include a first pad P1 and a second pad P2 connected to the first line L1 and the second line L2 respectively and may selectively further include the third pad P3 connected to the third line L3. When the display device DD is driven, the first pad P1 may receive the first power supply voltage VDD, and the second and third pads P2 and P3 may receive the second power supply voltage VSS. However, presence or absence of the third pad P3 and a power supply voltage applied to the third pad P3 may vary depending on embodiments.

FIGS. 4-7 are plan views illustrating the display device DD according to an embodiment of the present disclosure. For example, FIGS. 4-7 illustrate the display panel PNL provided in the display device DD according to some embodiments of the present disclosure and illustrate embodiments differently modified from the embodiment of FIG. 3.

Referring to FIGS. 4-7, at least one of the first, second, and third lines L1, L2, and L3 may have an open loop shape. In this case, at least one of the first, second, and third lines L1, L2, and L3 may only partially surround the display area DA.

Figure 4:
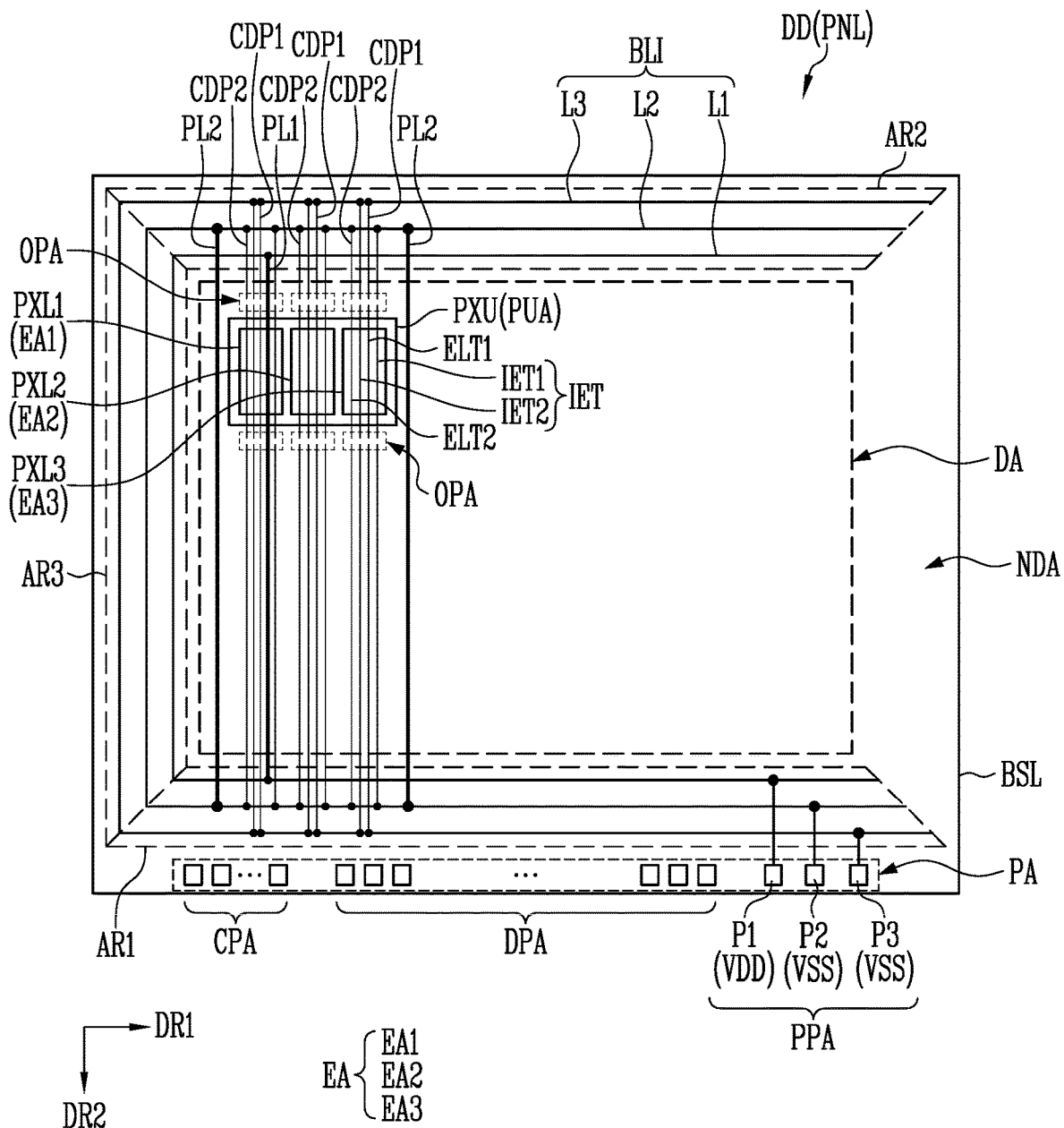
FIGS. 4-7 are plan views of a display device according to an embodiment of the present disclosure.

Referring to FIG. 4, each of the first, second, and third lines L1, L2, and L3 may have a left or right open loop shape to have a "⊐" or "C" shape. For example, each of the first, second, and third lines L1, L2, and L3 may include the first, second, and third areas AR1, AR2, and AR3 of FIG. 3, and the fourth area AR4 may not be included.

Figure 5:
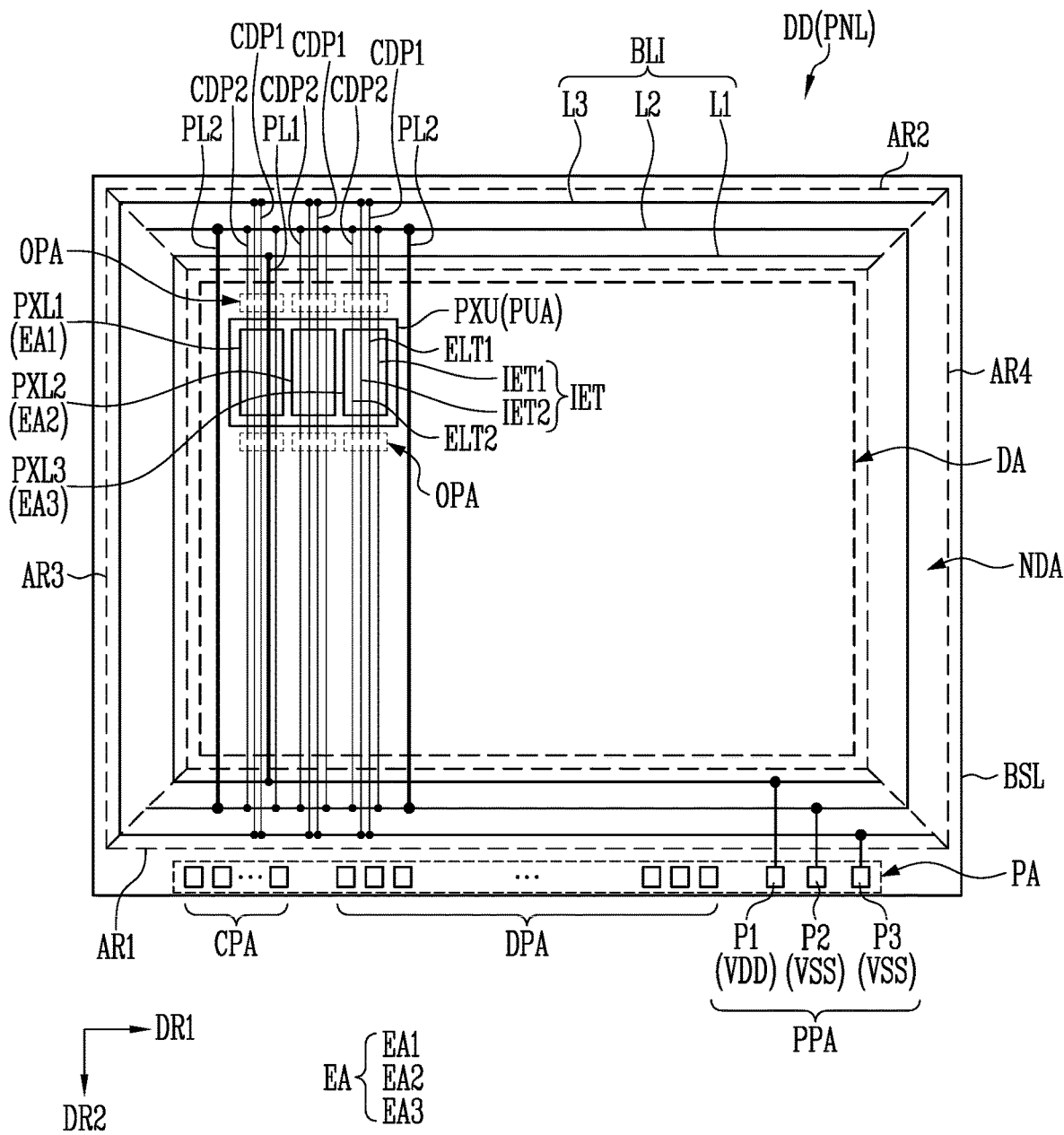

Referring to FIG. 5, each of the first, second, and third lines L1, L2, and L3 may have a left or right open loop shape, and at least one bus line BLI from among the first, second, and third lines L1, L2, and L3 may be opened in a different direction from the other bus lines BLI. For example, each of the first and third lines L1 and L3 may include the first, second, and third areas AR1, AR2, and AR3 of FIG. 3 and have a right open loop shape in which the fourth area AR4 is not included, and the second line L2 may include the first, second, and fourth areas AR1, AR2, and AR4 of FIG. 3 and have a right open loop shape in which the third area AR3 is not included.

Figure 6:
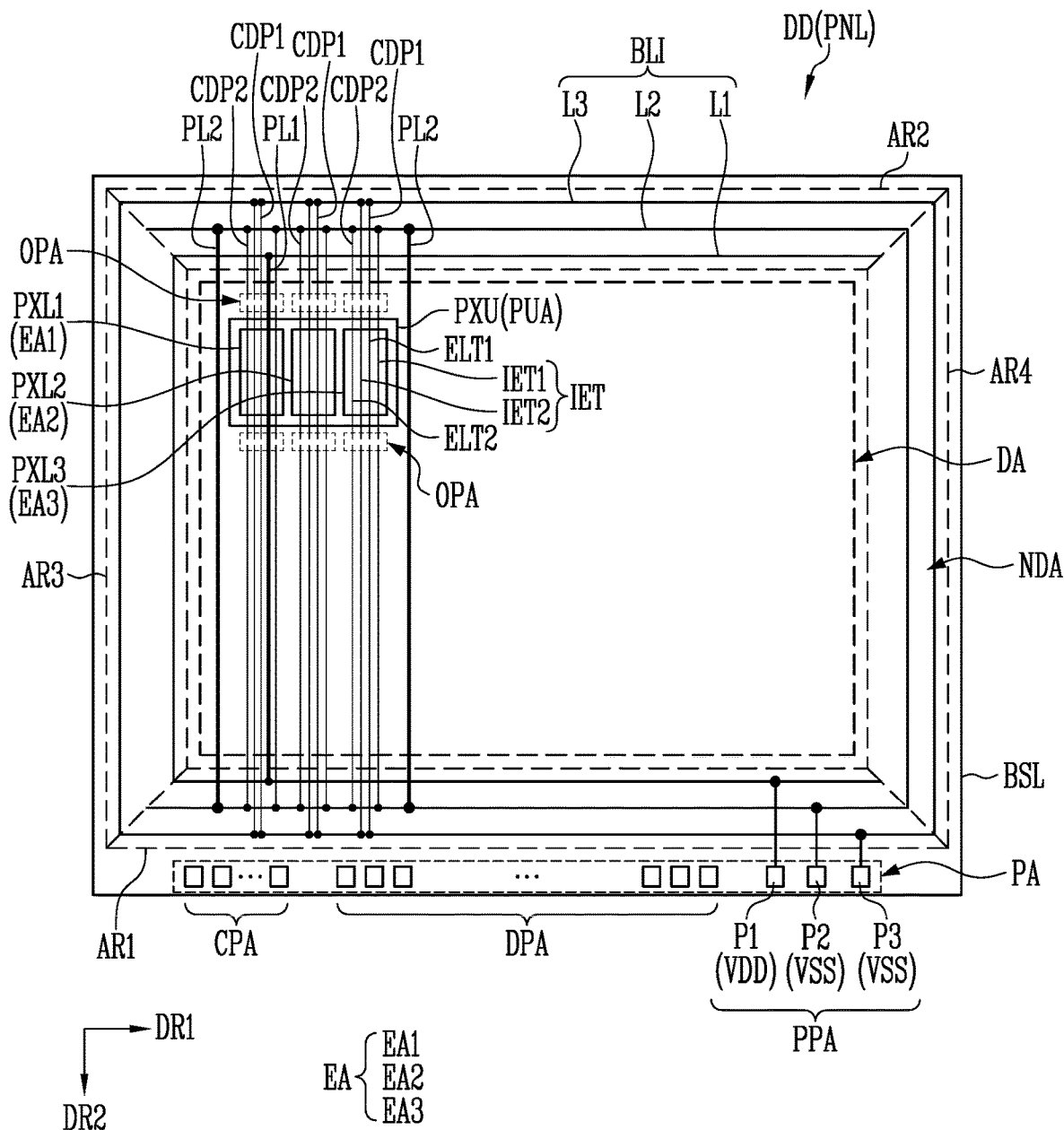

Referring to FIG. 6, at least one bus line BLI from among the first, second, and third lines L1, L2, and L3 may have a left or right open loop shape, and the other bus lines BLI may have a closed loop shape. For example, the first and second lines L1 and L2 have a right and left open loop shape respectively, and the third line L3 may have a closed loop shape surrounding the first and second lines L1 and L2. In another embodiment, the first and second lines L1 and L2 may have an open loop shape (for example, left or right open loop shape) opened in the same direction, and the third line L3 may have a closed loop shape surrounding the first and second lines L1 and L2. In another embodiment, at least one of the first and second lines L1 and L2 may have a closed loop shape, and the third line L3 may have an open loop shape.

According to the embodiments of FIGS. 4-6, the first and second alignment signals may be bidirectionally transmitted to the pixels PXL through the second and third lines L2 and L3 during a step of aligning the light emitting elements LD. In addition, when the display device DD is driven, the first and second power supply voltages VDD and VSS may be supplied bidirectionally to the pixels PXL through the first and second lines L1 and L2. Accordingly, voltage drops of the first and second alignment signals and the first and second power supply voltages VDD and VSS may be reduced or prevented.

Figure 7:
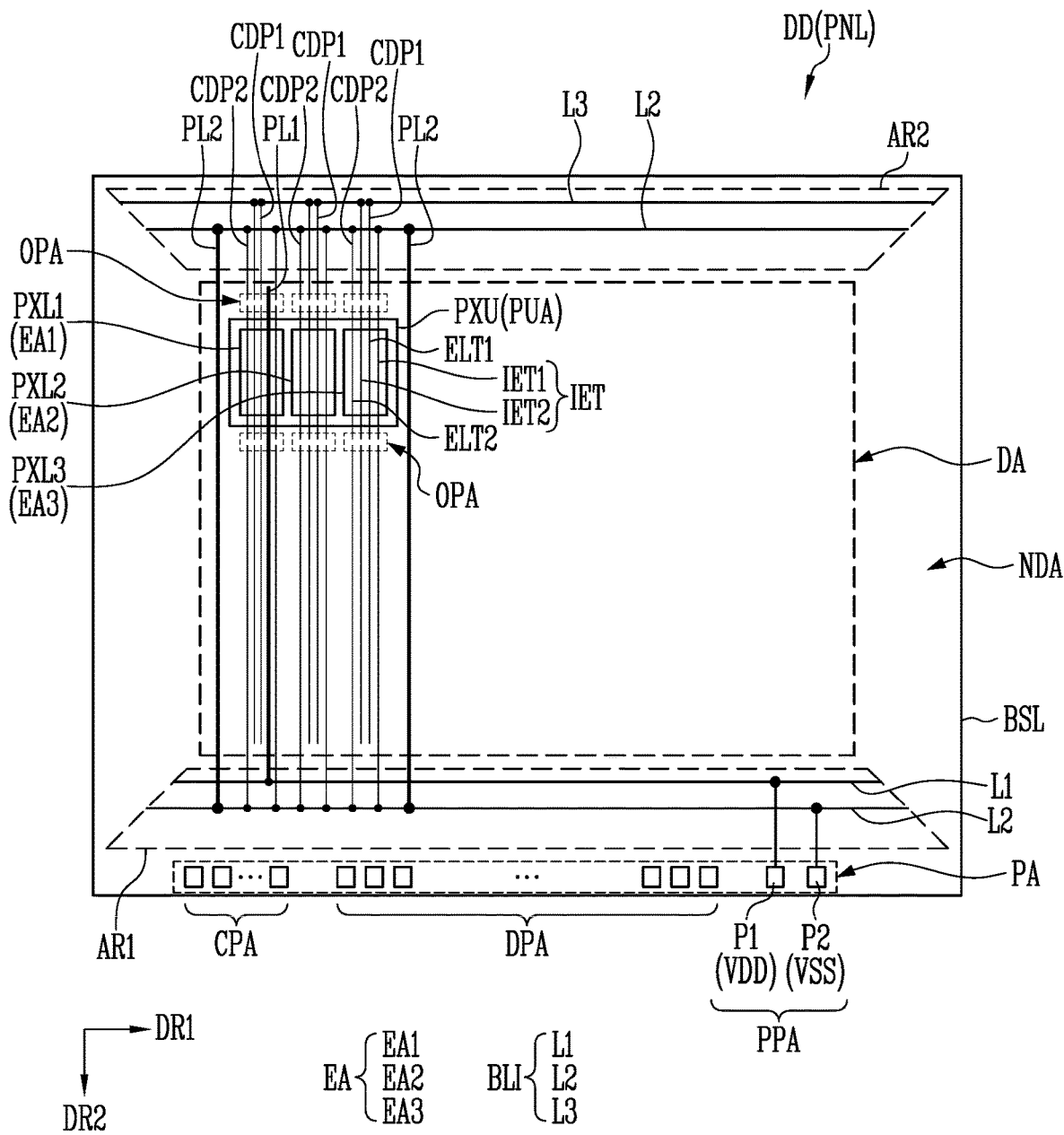

Referring to FIG. 7, the first line L1 may include only the first area AR1 and may not include the second, third, and fourth areas AR2, AR3, and AR4. For example, the first line L1 may be arranged only in a lower area of the display area DA and may not be arranged in an upper area, a left area, and a right area of the display area DA.

The second line L2 may include only the first and second areas AR1 and AR2 and may not include the third and fourth areas AR3 and AR4. For example, the second line L2 may be arranged only in the upper and lower areas of the display area DA and may not be arranged in the left and right areas of the display area DA.

The third line L3 may include only the second area AR2 and may not include the first, third, and fourth areas AR1, AR3, and AR4. For example, the third line L3 may be arranged only in the upper area of the display area DA and may not be arranged in the lower area, a left area, and a right area of the display area DA. In an embodiment, the display device DD may include at least one pad and/or a line connected to the third line L3 to supply a bias voltage (e.g., a set or predetermined bias voltage) to the third line L3. In another embodiment, the third line L3 may be floated to be electrically isolated.

In this case, during a step of aligning the light emitting elements LD, the first and second alignment signals may be supplied to the pixels PXL in one direction through the second and third lines L2 and L3. In addition, when the display device DD is driven, the first and second power supply voltages VDD and VSS may be supplied to the pixels PXL in one direction through the first and second lines L1 and L2.

Figure 8:
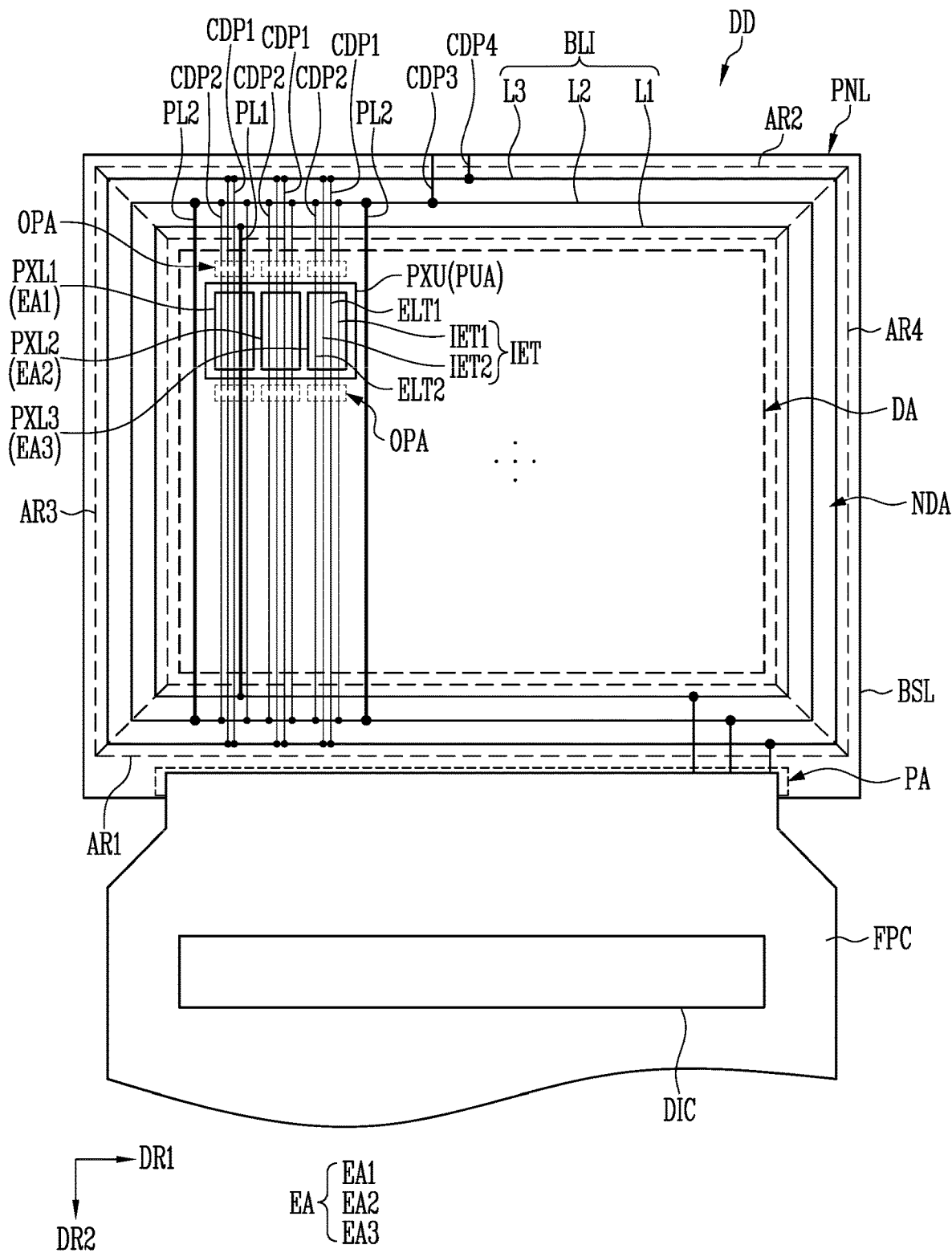
FIG. 8 is a plan view illustrating a display device according to an embodiment of the present disclosure.

FIG. 8 is a plan view illustrating the display device DD according to an embodiment of the present disclosure.

Referring to FIGS. 3-8, the display device DD may further include a circuit board FPC connected to the display panel PNL through the pad portion PA. The circuit board FPC may be a flexible circuit board but is not limited thereto.

A drive circuit DIC may be mounted on the circuit board FPC (or another circuit board connected thereto). The drive circuit DIC may generate various drive signals and/or power supply voltages for driving the pixels PXL. To this end, the drive circuit DIC may include at least one of a scan driver for supplying scan signals (or gate signals) and/or other control signals to the pixels PXL, a data driver for supplying data signals of each frame to the pixels PXL, a timing controller for controlling operations of the scan driver and the data driver, and a power supply for supplying the first and second power supply voltages VDD and VSS to the pixels PXL.

In an embodiment, the display panel PNL may further include a third conductive pattern CDP3 connected to the second line L2 and a fourth conductive pattern CDP4 connected to the third line L3. Similarly, each of the display panels PNL according to the embodiments of FIGS. 3-7 may also selectively include third and fourth conductive patterns CDP3 and CDP4.

The third and fourth conductive patterns CDP3 and CDP4 may connect the first alignment pad and the second alignment pad provided in a mother board to the second line L2 and the third line L3 respectively during a step of manufacturing the display device DD, e.g., during a step of aligning the light emitting elements LD in each light emitting area EA. The third and fourth conductive patterns CDP3 and CDP4 may be separated from the first and second alignment pads during a step of separating respective cells formed on the mother board into respective display panels PNL, and during this process, each end may be floated. However, the present disclosure is not limited thereto. For example, in another embodiment, the third and/or fourth conductive patterns CDP3 and CDP4 may be removed during the step of manufacturing the display device DD. In another embodiment, one end of the third and/or fourth conductive patterns CDP3 and CDP4 may not be floated and may also be connected to a circuit element, an electrode, a line, and/or a pad (e.g., a set or predetermined circuit element, electrode, line, and/or pad).

Figure 9:
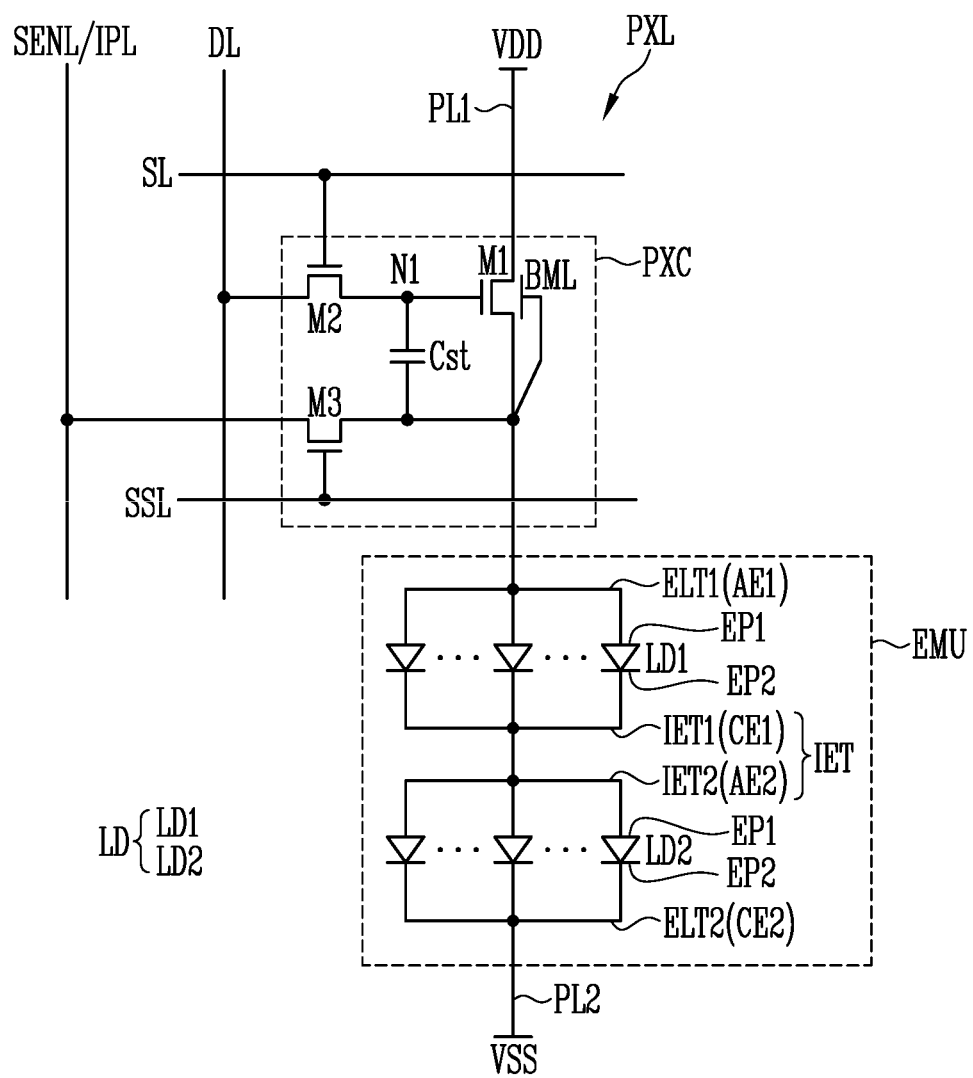
FIG. 9 is a circuit diagram illustrating a pixel according to an embodiment of the present disclosure.

FIG. 9 is a circuit diagram illustrating the pixel PXL according to an embodiment of the present disclosure. For example, FIG. 9 illustrates an embodiment of the pixel PXL including a light emitting unit EMU including two series stages. However, a structure of the light emitting unit EMU may be variously changed depending on embodiments.

According to the described embodiment, the pixel PXL illustrated in FIG. 9 may be one of the first color pixel PXL1, the second color pixel PXL2, and the third color pixel PXL3 that are provided in the display panel PNL according to at least one of the embodiments of FIGS. 3-8. In addition, the first color pixel PXL1, the second color pixel PXL2, and the third color pixel PXL3 may have substantially the same structure or similar structures to each other.

Referring to FIG. 9, the pixel PXL may include a light emitting unit EMU for generating light with a luminance corresponding to a data signal. In addition, the pixel PXL may further include a pixel circuit PXC for driving the light emitting unit EMU.

The pixel circuit PXC may be connected between the first power supply voltage VDD and the light emitting unit EMU. In addition, the pixel circuit PXC may be connected to a scan line SL and a data line DL of the pixel PXL to control an operation of the light emitting unit EMU in response to a scan signal and a data signal supplied from the scan line SL and the data line DL respectively. In addition, the pixel circuit PXC may be selectively further connected to a sensing signal line SSL and a sensing line SENL. In an embodiment, characteristic information of each pixel PXL may be detected through the sensing line SENL, and an initialization power supply voltage may be transmitted to each pixel PXL through the sensing line SENL. That is, the sensing line SENL may be an initialization power line IPL.

The pixel circuit PXC may include at least one transistor and a capacitor. For example, the pixel circuit PXC may include a first transistor M1, a second transistor M2, a third transistor M3, and a storage capacitor Cst.

The first transistor M1 is connected between the first power supply voltage VDD and the first electrode ELT1 of the light emitting unit EMU. In addition, a gate electrode of the first transistor M1 is connected to a first node N1. The first transistor M1 controls a drive current supplied to the light emitting unit EMU in response to a voltage at the first node N1. That is, the first transistor M1 may be a drive transistor that controls a drive current of the pixel PXL.

In an embodiment, the first transistor M1 may selectively include a bottom metal layer BML (also referred to as a "bottom metal electrode", a "bottom electrode", or a "bottom light blocking layer"). The gate electrode of the first transistor M1 and the bottom metal layer BML may overlap each other with an insulating layer interposed therebetween.

In an embodiment in which the first transistor M1 includes the bottom metal layer BML, a back-biasing technique (or sync technique) may be used to move a threshold voltage of the transistor M1 in a negative direction or a positive direction by applying a back-biasing voltage to the bottom metal layer BML of the first transistor M1 when driving the pixel PXL. For example, by connecting the bottom metal layer BML to one electrode of the first transistor M1, for example, a source electrode to apply a source-sink technology, the threshold voltage of the first transistor M1 may be moved in a negative direction or a positive direction. In addition, when the bottom metal layer BML is arranged under a semiconductor layer constituting a channel of the first transistor M1, the bottom metal layer BML serves as a light shielding pattern to stabilize operation characteristics of the first transistor Mi. However, a function and a utilization method of the bottom metal layer BML are not limited thereto.

The second transistor M2 is connected between the data line DL and the first node N1. In addition, a gate electrode of the second transistor M2 is connected to the scan line SL. When a scan signal of a gate-on voltage (for example, a high level voltage) is supplied from the scan line SL to the gate electrode of the second transistor M2, the second transistor M2 is turned on to electrically connect the data line DL to the first node N1.

A data signal of a corresponding frame is supplied to the data line DL during each frame period, and the data signal is transmitted to the first node N1 through the second transistor M2 being turned on during a period in which the scan signal of the gate-on voltage is supplied to the gate electrode of the second transistor M2. That is, the second transistor M2 may be a switching transistor for transmitting each data signal to the pixel PXL.

One electrode of the storage capacitor Cst is connected to the first node N1, and the other electrode is connected to a second electrode of the first transistor M1. The storage capacitor Cst charges a voltage (or holds a charge) corresponding to the data signal supplied to the first node N1 during each frame period.

The third transistor M3 is connected between the first electrode ELT1 of the light emitting unit EMU (or the second electrode of the first transistor M1) and the sensing line SENL. In addition, a gate electrode of the third transistor M3 is connected to the sensing signal line SSL. The third transistor M3 may transmit a voltage applied to the first electrode ELT1 of the light emitting unit EMU to the sensing line SENL in response to the sensing signal supplied to the sensing signal line SSL during a sensing period (e.g., a set or predetermined sensing period). The voltage transmitted through the sensing line SENL may be provided to an external circuit (for example, a timing controller), and the external circuit may extract characteristic information (for example, a threshold voltage and so on of the first transistor M1) of each pixel PXL based on the supplied voltage. The extracted characteristic information may be used to convert image data so that characteristic deviations between the pixels PXL may be compensated.

FIG. 9 illustrates all the transistors included in the pixel circuit PXC, for example, the first, second, and third transistors M1, M2, and M3 as N-type transistors, but the present disclosure is limited thereto. That is, at least one of the first, second, and third transistors M1, M2, and M3 may also be changed to at least one P-type transistor.

In addition, a structure and a drive method of the pixel PXL may be variously changed. For example, the pixel circuit PXC may be constituted by a pixel circuit having various structures and/or drive methods in addition to the embodiment illustrated in FIG. 9.

For example, the pixel circuit PXC may not include the third transistor M3. In some embodiments, the pixel circuit PXC may also include other circuit elements such as a compensation transistor for compensating for a threshold voltage and so on of the first transistor M1, an initialization transistor for initializing a voltage of the first node N1 and/or the first electrode ELT1 of the light emitting unit EMU, a light emission control transistor for controlling a period in which a drive current is supplied to the light emitting unit EMU, and/or a boosting capacitor for boosting the voltage of the first node N1.

In another embodiment, when the pixel PXL is a pixel of a passive light emitting display device, the pixel circuit PXC may be omitted. In this case, the light emitting unit EMU may be directly connected to the scan line SL, the data line DL, the first power line PL1, the second power line PL2, and/or other signal lines or power lines.

The light emitting unit EMU may include a first electrode ELT1, a second electrode ELT2, and at least one light emitting element LD connected between the first and second electrodes ELT1 and ELT2. For example, the light emitting unit EMU may include the first electrode ELT1 (also referred to as a "first pixel electrode" or a "first alignment electrode") connected to the first power supply voltage VDD via the pixel circuit PXC and the first power line PL1, the second electrode ELT2 (also referred to as a "second pixel electrode" or a "second alignment electrode") connected to the second power supply voltage VSS through the second power line PL2, and a plurality of light emitting elements LD connected between the first and second electrodes ELT1 and ELT2.

The first power supply voltage VDD and the second power supply voltage VSS may have different potentials so that the light emitting elements LD emit light. For example, the first power supply voltage VDD may be a pixel power supply voltage of a high potential, and the second power supply voltage VSS may be a pixel power supply voltage of a low potential lower than the first power supply voltage VDD by a threshold voltage or higher of the light emitting elements LD.

In an embodiment, the light emitting unit EMU may include a plurality of light emitting elements LD connected in parallel between the first electrode ELT1 and the second electrode ELT2 in the same direction. For example, each light emitting element LD may have a first end portion EP1 (for example, P-type end portion) connected to the first power supply voltage VDD through the first electrode ELT1 and/or the pixel circuit PXC and the first power line PL1, and a second end portion EP2 (for example, N-type end portion) connected to the second power supply voltage VSS through the second electrode ELT2 and the second power line PL2. That is, the light emitting elements LD may be connected in parallel between the first and second electrodes ELT1 and ELT2 in a forward direction.

Each light emitting element LD connected between the first power supply voltage VDD and the second power supply voltage VSS in the forward direction may constitute each of effective light sources. In addition, the effective light sources may constitute the light emitting unit EMU of the pixel PXL.

The first end portions EP1 of the light emitting elements LD may be connected to the pixel circuit PXC through the first electrode ELT1 or so on of the light emitting unit EMU and may be connected to the first power supply voltage VDD through the pixel circuit PXC and the first power line PL1. In addition, the second end portions EP2 of the light emitting elements LD may be commonly connected to the second power supply voltage VSS through the second electrode ELT2, the second power line PL2, and so on.

In an embodiment, the light emitting unit EMU may have a series structure or a series-parallel structure including at least two series stages. For example, the light emitting unit EMU may include the light emitting elements LD provided in two series stages. In this case, the light emitting unit EMU may include at least one intermediate electrode IET connected between the first electrode ELT1 and the second electrode ELT2. In an embodiment, the intermediate electrode IET may include a first intermediate electrode IET1 and a second intermediate electrode IET2 connected integrally or non-integrated to each other. The first and second intermediate electrodes IET1 and IET2 may electrically form one intermediate electrode IET.

The first series stage may include the first electrode ELT1, the first intermediate electrode IET1, and at least one first light emitting element LD1 connected to each other in a forward direction between the first electrode ELT1 and the first intermediate electrode IET1. The first electrode ELT1 may be an anode electrode AE1 (also referred to as a "first anode electrode") of the first series stage. The first intermediate electrode IET1 may be a cathode electrode CE1 (also referred to as a "first cathode electrode") of the first series stage. The first end portion EP1 (for example, a P-type end portion) of the first light emitting element LD1 may be connected to the first electrode ELT1, and the second end portion EP2 (for example, an N-type end portion) of the first light emitting element LD1 may be connected to the first intermediate electrode IET1.

The second series stage may include the second intermediate electrode IET2, the second electrode ELT2, and at least one second light emitting element LD2 connected between the second intermediate electrode IET2 and the second electrode ELT2 in the forward direction. The second intermediate electrode IET2 may be an anode electrode AE2 (also referred to as a "second anode electrode") of the second series stage. The second electrode ELT2 may be a cathode electrode CE2 (also referred to as a "second cathode electrode") of the second series stage. The first end portion EP1 (for example, a P-type end portion) of the second light emitting element LD2 may be connected to the second intermediate electrode IET2, and the second end portion EP2 (for example, an N-type end portion) of the second light emitting element LD2 may be connected to the second electrode ELT2.

In some embodiments, the number of series stages constituting each light emitting unit EMU may be variously changed depending on embodiments. For example, the light emitting unit EMU may include a plurality of light emitting elements LD provided in three or more series stages.

When the light emitting unit EMU is constituted by the light emitting elements LD having the same characteristics (for example, the same size and/or the same number), where each of the light emitting elements is an effective light source, in a case in which the light emitting elements LD are connected in a series structure or in a series-parallel structure, power efficiency may be increased or improved. In addition, in the pixel PXL in which the light emitting elements LD are connected in a series structure or a series-parallel structure, even when a short-circuit defect and so on occur at some of series stages, a certain degree of luminance may be expressed through the light emitting elements LD of the other series stage, and thus, a possibility of dark spot defect of the pixel PXL may be reduced.

Although FIG. 9 illustrates an embodiment in which the light emitting elements LD are connected in a series-parallel structure, the present disclosure is not limited thereto. For example, in another embodiment, the light emitting elements LD constituting the light emitting unit EMU of each pixel PXL may also be connected to each other only in parallel or in series.

Each of the light emitting elements LD connected between the first power supply voltage VDD and the second power supply voltage VSS in the forward direction may constitute each of the effective light sources. In addition, the effective light sources may constitute the light emitting unit EMU of the pixel PXL.

When a drive current is supplied through the corresponding pixel circuit PXC, the light emitting elements LD may emit light with a luminance corresponding to the drive current. For example, during each frame period, the pixel circuit PXC may supply the light emitting unit EMU with a drive current corresponding to a gradation value to be expressed in the corresponding frame. Accordingly, while the light emitting elements LD emit light with a luminance corresponding to a drive current, the light emitting unit EMU may express a luminance corresponding to the drive current.

In an embodiment, the light emitting unit EMU may also further include at least one ineffective light source in addition to the light emitting elements LD constituting the respective effective light sources. For example, one or more ineffective light emitting elements that are arranged in a reverse direction or have at least one end portion that is floated, may be further connected to at least one series stage. The ineffective light emitting element maintains an inactive state even when a forward drive voltage is applied between the first and second electrodes ELT1 and ELT2, thereby maintaining a substantial non-light emission state.

Figure 10:
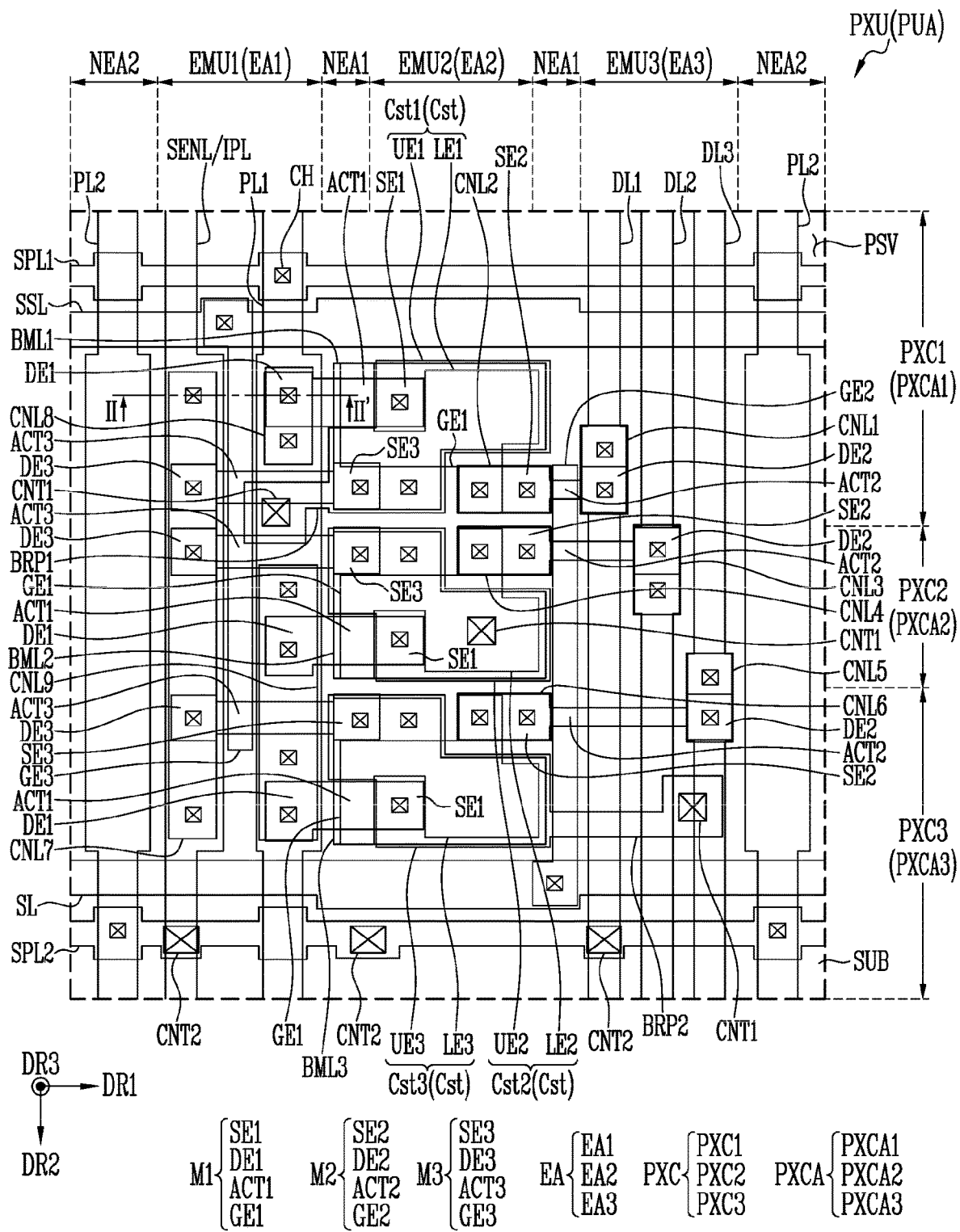
FIG. 10 is a plan view illustrating pixel circuit areas of a display device according to an embodiment of the present disclosure.
Figure 11:
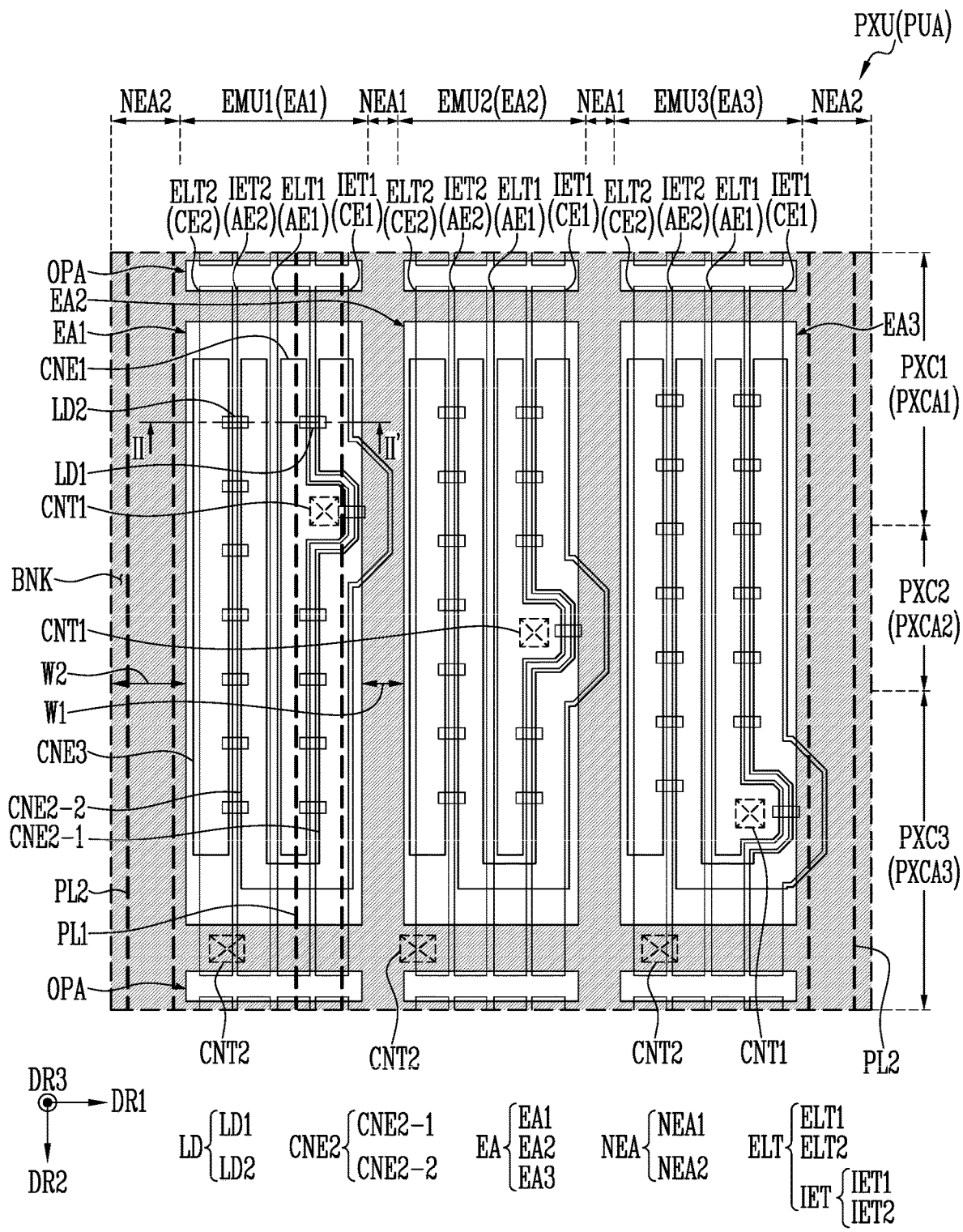
FIG. 11 is a plan view illustrating light emitting areas of a display device according to an embodiment of the present disclosure.

FIG. 10 is a plan view illustrating pixel circuit areas PXCA of the display device DD according to an embodiment of the present disclosure, and FIG. 11 is a plan view illustrating light emitting areas EA of the display device DD according to an embodiment of the present disclosure. FIGS. 10 and 11 illustrate example structures of the pixel circuit areas PXCA and the light emitting area EA, centering around a unit pixel area PUA in which one pixel unit PXU is arranged. FIGS. 12 and 13 illustrate different embodiments of cross sections taken along the lines II-II' of FIGS. 10 and 11. The embodiment of FIG. 13 further includes bank patterns BNP when compared with the embodiment of FIG. 12.

In FIGS. 10-13, each electrode and each insulating layer are each illustrated as a single layer, but the present disclosure is not limited thereto. For example, each electrode or each insulating layer may be composed of a single layer or multiple layers.

In describing the embodiments of the present disclosure, "formed and/or provided in the same layer" means being formed in the same process, and "formed and/or provided in different layers" means being formed in different processes.

In FIGS. 10-13, a first direction DR1 may be a horizontal direction (or a row direction), and a second direction DR2 may be a vertical direction (or a column direction), but the present disclosure is not limited thereto. In addition, a third direction DR3 may be a direction crossing (for example, orthogonal to) the first and second directions DR1 and DR2. For example, the third direction DR3 may be a thickness or height direction of the display panel PNL.

Referring to FIGS. 1-13, each pixel unit PXU may include a first color pixel PXL1, a second color pixel PXL2, and a third color pixel PXL3. The first color pixel PXL1 may include a first pixel circuit PXC1 and a first light emitting unit EMU1, and the second color pixel PXL2 may include a second pixel circuit PXC2 and a second light emitting unit EMU2. The third color pixel PXL3 may include a third pixel circuit PXC3 and a third light emitting unit EMU3.

The pixel unit PXU may include a pixel circuit layer PCL and a light emitting element layer DPL arranged to overlap each other on a base layer BSL. For example, the pixel circuit layer PCL may be formed on one surface of the base layer BSL, and the light emitting element layer DPL may be formed on the pixel circuit layer PCL.

The base layer BSL may be a rigid substrate or a flexible substrate. A material applied to the base layer BSL may have resistance (or heat resistance) against a high processing temperature during a process of manufacturing a display device.

The rigid substrate may be one of, for example, a glass substrate, a quartz substrate, a glass ceramic substrate, and a crystalline glass substrate. The flexible substrate may be one of a film substrate including a polymer organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

A pixel circuit layer PCL including a plurality of insulating layers and a plurality of conductive layers, and a light emitting element layer DPL may be arranged on the base layer BSL. The insulating layers of the pixel circuit layer PCL and the light emitting element layer DPL may include, for example, a buffer layer BFL, a gate insulating layer GI, an interlayer insulating layer ILD, a passivation layer PSV, and first to third insulating layers INS1 to INS3 that are sequentially provided on the base layer BSL. The conductive layers may be provided and/or formed between the above-described insulating layers. The conductive layers may include, for example, a first conductive layer provided on the base layer BSL, a second conductive layer provided on the gate insulating layer GI, a third conductive layer provided on the interlayer insulating layer ILD, a fourth conductive layer provided on the passivation layer PSV, and a fifth conductive layer provided on the second insulating layer INS2. However, the insulating layers and the conductive layers provided on the base layer BSL are not limited to the above-described embodiments, and in some embodiments, other insulating layers and other conductive layers other than the insulating layers and conductive layers may also be provided over the base layer BSL.

The pixel circuit layer PCL may include a first pixel circuit area PXCA1, a second pixel circuit area PXCA2, and a third pixel circuit area PXCA3 sequentially arranged in a second direction DR2 in each unit pixel area PUA. The first, second, and third pixel circuits PXC1, PXC2, and PXC3 may be formed in the first, second, and third pixel circuit areas PXCA1, PXCA2, and PXCA3, respectively.

In addition, the pixel circuit layer PCL may include a line portion connected to each pixel unit PXU. The line portion may include signal lines and power lines that transmit signals or power supply voltages (e.g., set or predetermined signals or power supply voltages) to each pixel unit PXU. The signal lines may include scan lines SL and sensing signal lines SSL of each row, and data lines DL1 to DL3 and sensing lines SENL/IPL of each pixel unit column. The power lines may include a first power line PL1 and a second power line PL2. In an embodiment, at least one first power line PL1 and at least one second power line PL2 may be formed in each pixel unit column.

The scan line SL may extend in a first direction DR1. A scan signal may be applied to the scan line SL. At least one scan line SL may be arranged in each pixel row. The scan line SL may be a third conductive layer provided on the interlayer insulating layer ILD. The third conductive layer may be composed of a single layer formed of a single material selected from or a mixture of copper (Cu), molybdenum (Mo), tungsten (W), neodymium (Nd), titanium (Ti), aluminum (Al), silver (Ag), and an alloy thereof, or may be composed of a double-layer structure or a multilayer structure of low-resistance materials such as molybdenum (Mo), titanium (Ti), copper (Cu), aluminum (Al), and silver (Ag) to reduce line resistance.

The interlayer insulating layer ILD may be an inorganic insulating film including an inorganic material. For example, the interlayer insulating layer ILD may include at least one of a metal oxide such as silicon nitride (SiNx), silicon oxide (SiOx), silicon oxynitride (SiOxNy), and aluminum oxide (AlOx). However, a material of the interlayer insulating layer ILD is not limited to the above-described embodiments. In some embodiments, the interlayer insulating layer ILD may also be formed of an organic insulating film including an organic material. The interlayer insulating layer ILD may be provided as a single layer but may also be provided as multiple layers of at least double layers.

The data lines DL1 to DL3 may include a first data line DL1, a second data line DL2, and a third data line DL3 that are spaced from each other in the first direction DR1 and extend in the second direction DR2 different from, for example, crossing the first direction DR1. A corresponding data signal may be applied to each of the first to third data lines DL1 to DL3. The first data line DL1 may be electrically connected to the second transistor M2 of the first color pixel PXL1, the second data line DL2 may be electrically connected to the second transistor M2 of the second color pixel PXL2, and the third data line DL3 may be electrically connected to of the second transistor M2 of the third color pixel PXL3. The first to third data lines DL1 to DL3 may be a first conductive layer provided on the base layer BSL. The first conductive layer may include the same material as the third conductive layer or may include one or more materials selected from materials discussed as a constituent material of the first conductive layer.

The sensing signal line SSL may extend in the first direction DR1 to be spaced from the scan line SL. A control signal may be applied to the sensing signal line SSL. The sensing signal line SSL may be provided and/or formed on the same layer as the scan line SL. For example, the sensing signal line SSL may be a third conductive layer provided on the interlayer insulating layer ILD.

The first power line PL1 may extend in the second direction DR2. The first power line PL1 may be a first conductive layer provided and/or formed on the base layer BSL. The first power line PL1 may be provided on the same layer as the first to third data lines DL1 to DL3 and may be spaced from the first to third data lines DL1 to DL3 when viewed in a plane. The first power supply voltage VDD may be applied to the first power line PL1.

In an embodiment, a first sub power line SPL1 that is connected to the first power line PL1 and crosses the first power line PL1 may be further arranged in the display area DA.

The first sub power line SPL1 may extend in the first direction DR1. The first sub power line SPL1 may be a third conductive layer provided and/or formed on the interlayer insulating layer ILD. The first sub power line SPL1 may be provided on the same layer as the sensing signal line SSL and may be spaced from the sensing signal line SSL when viewed in a plane.

The first power line PL1 and the first sub power line SPL1 may be electrically connected to each other through a corresponding contact hole CH. For example, the first power line PL1 and the first sub power line SPL1 may be electrically connected to each other through the contact hole CH sequentially penetrating a buffer layer BFL, a gate insulating layer GI, and an interlayer insulating layer ILD. In this case, the first power supply voltage VDD may be supplied to the pixels PXL through mesh-type lines.

In an embodiment of the present disclosure, the first power line PL1 may overlap at least one light emitting area EA from among the first to third light emitting areas EA1 to EA3. For example, the first power line PL1 may overlap a first light emitting area EA1 in each unit pixel column.

In some embodiments, the first power line PL1 may maintain a floating state during a step of manufacturing the display device DD, e.g., during a step of alignment of the light emitting elements LD. To this end, in the embodiment of the present disclosure, the bus line BLI (for example, the first line L1 of FIGS. 3-8) connected to the first power line PL1 is formed separately from the bus lines BLI (for example, the second and third lines L2 and L3 of FIGS. 3-8) used for aligning the light emitting elements LD. Accordingly, even when the first power line PL1 overlaps at least one light emitting area EA, influence on alignment of the light emitting elements LD may be prevented or reduced.

That is, in the embodiment of the present disclosure, an alignment signal is not applied to the first power line PL1, and accordingly, even when the first power line PL1 is arranged to overlap at least one light emitting area EA, alignment characteristics of the light emitting elements LD may be prevented from being degraded due to the first power line PL1. According to the above-described embodiments, the light emitting areas EA need not be designed to avoid the first power line PL1, and thus, areas of the light emitting areas EA are prevented from being limited (or reduced) due to the first power line PL1. In addition, the first power line PL1 maintains a floating state during the step of aligning the light emitting elements LD, and thus, separation of the light emitting elements LD from a corresponding light emitting element arrangement area (e.g., a predetermined light emitting element arrangement area) due to the first power line PL1 may be prevented or reduced.

Accordingly, a large number of the light emitting elements LD may be supplied to each light emitting area EA by sufficiently obtaining a volume amount (or a floor area ratio) of each of the light emitting areas EA, and the light emitting elements LD may be stably aligned between the alignment electrodes ELT. According to the described embodiment of the present disclosure, a sufficient number of the light emitting elements LD may be supplied to each light emitting area EA, and a utilization rate and a degree of alignment of the supplied light emitting elements LD may be increased. Accordingly, light emission characteristics of each pixel PXL may be improved.

In addition, it is not necessary to form a separate shield layer for shielding influence (for example, an electric field additionally formed by the first power line PL1) of the first power line PL1 during a step of aligning the light emitting elements LD. Accordingly, masks to be used to manufacture the display panel PNL (particularly, pixels PXL) may be reduced, and manufacturing efficiency may be increased.

The second power line PL2 may extend in the second direction DR2. The second power line PL2 may be a first conductive layer provided and/or formed on the base layer BSL. The second power line PL2 may be provided on the same layer as the first to third data lines DL1 to DL3 and the first power line PL1 and may be arranged to be spaced from the first to third data lines DL1 to DL1 to DL3) and the first power line PL1 when viewed in a plane. The second power supply voltage VSS may be applied to the second power line PL2.

In an embodiment, a second sub power line SPL2 connected to the second power line PL2 to cross the second power line PL2 may be further arranged in the display area DA.

The second sub power line SPL2 may extend in the first direction DR1. The second sub power line SPL2 may be a third conductive layer provided and/or formed on the interlayer insulating layer ILD. The second sub power line SPL2 may be provided on the same layer as the scan line SL and may be arranged to be spaced from the scan line SL when viewed in a plane.

The second power line PL2 and the second sub power line SPL2 may be electrically connected to each other through a corresponding contact hole CH. For example, the second power line PL2 and the second sub power line SPL2 may be electrically connected to each other through the contact hole CH sequentially penetrating the buffer layer BFL, the gate insulating layer GI, and the interlayer insulating layer ILD. In this case, the second power supply voltage VSS may be supplied to the pixels PXL through mesh-type lines.

In an embodiment of the present disclosure, the second power line PL2 may be arranged in a non-light emitting area NEA so as not to overlap the first to third light emitting areas EA1 to EA3. For example, the second power line PL2 may be arranged on at least one side of the unit pixel area PXU so as not to overlap the first to third light emitting areas EA1 to EA3. For example, the second power line PL2 may be located in a second non-light emitting areas NEA2 located on both sides of each unit pixel area PXU.

Similarly, the second sub power line SPL2 may also be arranged in the non-light emitting area NEA so as not to overlap the first to third light emitting areas EA1 to EA3. For example, the second sub power line SPL2 may be arranged in the non-light emitting area NEA located in upper portions and/or lower portions of the first to third light emitting areas EA1 to EA3.

In some embodiments, the non-light emitting area NEA including the first and second non-light emitting areas NEA1 and NEA2 is an area covered by a hydrophobic bank BNK, and the light emitting elements LD are not supplied to the non-light emitting area NEA. Thus, during a step of aligning the light emitting elements LD, even when a second alignment signal is supplied through the second power line PL2 and the second line L2 commonly connected to some of the alignment electrodes ELT (or the second alignment line before being separated into the alignment electrodes ELT), separation of the light emitting elements LD due to the second alignment signal applied to the second power line PL2 may be prevented.

That is, according to the described embodiment of the present disclosure, the second power line PL2 is covered by the bank BNK, and thus, the second power line PL2 and alignment electrodes (e.g., predetermined alignment electrodes) (or the second alignment line) may share any one bus line BLI, for example, the second line L2 of FIGS. 3-8. Accordingly, the non-display area NDA may be reduced or minimized. In addition, by preventing or reducing influence of the second power line PL2 on alignment of the light emitting elements LD, the light emitting elements LD may be stably supplied and aligned between the alignment electrodes ELT.

The sensing line SENL/IPL may extend in the second direction DR2 and may be arranged between the second power line PL2 and the first power line PL1. The sensing line SENL/IPL may be electrically connected to some components arranged in each of the first to third pixel circuit areas PXCA1 to PXCA3, for example, the third transistor M3 through a seventh connection line CNL7. The sensing line SENL/IPL may be used to detect characteristic information of each pixel PXL and may be used to apply an initialization power supply voltage to each pixel PXL. The sensing line SENL/IPL may be a first conductive layer provided on the base layer BSL. The sensing lines SENL/IPL may be provided and/or formed on the same layer as the first to third data lines DL1 to DL3 and the first and second power lines PL1 and PL2.

The seventh connection line CNL7 may extend in the second direction DR2 and may overlap the sensing line SENL/IPL when viewed in a plane. The seventh connection line CNL7 may be electrically connected to the sensing line SENL/IPL through the corresponding contact hole CH. For example, the seventh connection line CNL7 may be electrically connected to the sensing line SENL/IPL through at least two contact holes CH sequentially penetrating the buffer layer BFL, the gate insulating layer GI, and the interlayer insulating layer ILD. In addition, the seventh connection line CNL7 may be electrically connected to the third transistor M3 arranged in each of the first to third color pixels PXL1 to PXL3 through the corresponding contact holes CH sequentially penetrating the gate insulating layer GI and the interlayer insulating layer ILD. For example, the seventh connection line CNL7 may be electrically connected to the third transistor M3 of the first color pixel PXL1 through the contact hole CH sequentially penetrating the gate insulating layer GI and the interlayer insulating layer ILD, the seventh connection line CNL7 may be electrically connected to the third transistor M3 of the second color pixel PXL2 through the contact hole CH sequentially penetrating the gate insulating layer GI and the interlayer insulating layer ILD, and the seventh connection line CNL7 may be electrically connected to the third transistor M3 of the third color pixel PXL3 through the contact hole CH sequentially penetrating the gate insulating layer GI and the interlayer insulating layer ILD.

The first and second power lines PL1 and PL2 and the sensing line SENL/IPL described above may be components commonly provided to the first to third pixel circuit areas PXCA1 to PXCA3.

The first to third color pixels PXL1 to PXL3 may each include the pixel circuit layer PCL including each pixel circuit PXC.

The first color pixel PXL1, the second color pixel PXL2, and the third color pixel PXL3 may have substantially similar structures or the same structure. For the sake of convenience, the first color pixel PXL1 of the first to third color pixels PXL1 to PXL3 will be representatively described hereinafter, and description of the second and third color pixels PXL2 and PXL3 will be briefly made below.

The first color pixel PXL1 may be provided on the base layer BSL and may include the pixel circuit layer PCL including the pixel circuit PXC (for example, the first pixel circuit PXC1).

The pixel circuit layer PCL may include the buffer layer BFL, the pixel circuit PXC, and the passivation layer PSV.

The buffer layer BFL may be provided on the first conductive layer and may prevent impurities or so on from diffusing to the pixel circuit PXC. The buffer layer BFL may be an inorganic insulating film including an inorganic material. The buffer layer BFL may include at least one of metal oxides such as silicon nitride (SiNx), silicon oxide (SiOx), silicon oxynitride (SiOxNy), and aluminum oxide (AlOx). The buffer layer BFL may be provided as a single layer but may also be provided as multiple layers of at least double layers. When the buffer layer BFL is provided as the multiple layers, each layer may be formed of the same material or different materials. The buffer layer BFL may also be omitted depending on the materials and process conditions of the base layer BSL.

The first pixel circuit PXC1 may include the first to third transistors M1 to M3 and a first storage capacitor Cst1 provided on the buffer layer BFL.

The first transistor M1 may include a first gate electrode GE1, a first active pattern ACT1, a first source region SE1, and a first drain region DE1.

The first gate electrode GE1 may be connected to a second source region SE2 of the second transistor M2 through a second connection line CNL2. The first gate electrode GE1 may be provided and/or formed on the gate insulating layer GI. The first gate electrode GE1 may be a second conductive layer provided and/or formed on the gate insulating layer GI. The second conductive layer may be composed of a single layer formed of a single material selected from or a mixture of copper (Cu), molybdenum (Mo), tungsten (W), aluminum neodymium (AlNd), titanium (Ti), aluminum (Al), silver (Ag), and an alloy thereof, or may be composed of a double-layer structure or a multilayer structure of low-resistance materials such as molybdenum (Mo), titanium (Ti), copper (Cu), aluminum (Al), and silver (Ag) to reduce line resistance.

The gate insulating layer GI may include the same material as the interlayer insulating layer ILD or may include one or more materials selected from materials discussed as constituent materials of the interlayer insulating layer ILD. The gate insulating layer GI may be provided as a single layer but may be provided as multiple layers of at least double layers.

The second connection line CNL2 may be a third conductive layer provided and/or formed on the interlayer insulating layer ILD. One end of the second connection line CNL2 may be electrically connected to the first gate electrode GE1 through the contact hole CH penetrating the interlayer insulating layer ILD. The other end of the second connection line CNL2 may be electrically connected to the second source region SE2 of the second transistor M2 through the contact hole CH sequentially penetrating the gate insulating layer GI and the interlayer insulating layer ILD.

The first active pattern ACT1, the first source region SE1, and the first drain region DE1 may be semiconductor patterns formed of poly silicon, amorphous silicon, oxide semiconductor, and so on. The first active pattern ACT1, the first source region SE1, and the first drain region DE1 may each be formed of a semiconductor layer undoped with impurities or doped with impurities. For example, the first source region SE1 and the first drain region DE1 may each be formed of a semiconductor layer doped with impurities, and the first active pattern ACT1 may be formed of a semiconductor layer undoped with impurities. The impurities may include, for example, an n-type impurity.

The first active pattern ACT1, the first source region SE1, and the first drain region DE1 may be provided and/or formed on the buffer layer BFL.

The first active pattern ACT1 may be a region overlapping the first gate electrode GE1 and may be a channel region of the first transistor M1. When the first active pattern ACT1 is formed to be long, the channel region of the first transistor M1 may be formed to be long. In this case, a drive range of a gate voltage (or gate signal) applied to the first transistor M1 may be widened. Accordingly, gradation of light emitted from the light emitting elements LD may be precisely or closely controlled.

The first source region SE1 may be connected (or contacted) to one end of the first active pattern ACT1. In addition, the first source region SE1 may be electrically connected to a first bottom metal layer BML1 through the contact hole CH penetrating the buffer layer BFL.

The first bottom metal layer BML1 may be a first conductive layer provided and/or formed on the base layer BSL. The first bottom metal layer BML1 may be provided and/or formed on the same layer as the first to third data lines DL1 to DL3, the first and second power lines PL1 and PL2, and the sensing line SENL/IPL. The first bottom metal layer BML1 may be electrically connected to the first source region SE1 of the first transistor M1 through the corresponding contact hole CH.

The first drain region DE1 may be connected (or contacted) to the other end of the first active pattern ACT1. In addition, the first drain region DE1 may be electrically connected to the first power line PL1 through an eighth connection line CNL8.

One end of the eighth connection line CNL8 may be connected to the first drain region DE1 through the contact hole CH sequentially penetrating the gate insulating layer GI and the interlayer insulating layer ILD. In addition, the other end of the eighth connection line CNL8 may be electrically connected to the first power line PL1 through the contact hole CH sequentially penetrating the buffer layer BFL, the gate insulating layer GI, and the interlayer insulating layer ILD. The eighth connection line CNL8 may electrically connect the first drain region DE1 to the first power line PL1.

The second transistor M2 may include a second gate electrode GE2, a second active pattern ACT2, a second source region SE2, and a second drain region DE2.

The second gate electrode GE2 may extend in the second direction DR2 and may have a configuration commonly provided (or arranged) to the first to third color pixels PXL1 to PXL3. The second gate electrode GE2 may be a second conductive layer provided and/or formed on the gate insulating layer GI. The second gate electrode GE2 may be electrically connected to the scan line SL through the contact hole CH penetrating the interlayer insulating layer ILD. Accordingly, a scan signal applied to the scan line SL may be transmitted to the second gate electrode GE2.

Although the above embodiment describes that the second gate electrode GE2 has a configuration different (or non-integral) from the scan line SL to be electrically connected to the scan line SL through the corresponding contact hole CH, the present disclosure is not limited thereto. In some embodiments, the second gate electrode GE2 may also be provided integrally with the scan line SL. In this case, the second gate electrode GE2 may be provided as a part of the scan line SL or may be provided in a shape protruding from the scan line SL.

The second active pattern ACT2, the second source region SE2, and the second drain region DE2 may be semiconductor patterns formed of poly silicon, amorphous silicon, oxide semiconductor, or so on. The second active pattern ACT2, the second source region SE2, and the second drain region DE2 may be formed as semiconductor layers undoped with impurities or doped with impurities. For example, the second source region SE2 and the second drain region DE2 may be formed of semiconductor layers doped with impurities, and the second active pattern ACT2 may be formed of a semiconductor layer undoped with impurities. The impurities may include, for example, an n-type impurity.

The second active pattern ACT2, the second source region SE2, and the second drain region DE2 may be provided and/or formed on the buffer layer BFL.

The second active pattern ACT2 may be a region overlapping the second gate electrode GE2 and may be a channel region of the second transistor M2.

The second source region SE2 may be connected (or contacted) to one end of the second active pattern ACT2. In addition, the second source region SE2 may be connected to the first gate electrode GE1 of the first transistor M1 through the second connection line CNL2.

The second drain region DE2 may be connected (or contacted) to the other end of the second active pattern ACT2. In addition, the second drain region DE2 may be connected to the first data line DL1 through the first connection line CNL1.

The first connection line CNL1 may be a third conductive layer provided and/or formed on the interlayer insulating layer ILD. One end of the first connection line CNL1 may be electrically connected to the first data line DL1 through the contact hole CH sequentially penetrating the buffer layer BFL, the gate insulating layer GI, and the interlayer insulating layer ILD. The other end of the first connection line CNL1 may be connected to the second drain region DE2 through the contact hole CH sequentially penetrating the gate insulating layer GI and the interlayer insulating layer ILD. The second drain region DE2 and the first data line DL1 may be electrically connected to each other through the first connection line CNL1.

The third transistor M3 may include a third gate electrode GE3, a third active pattern ACT3, a third source region SE3, and a third drain region DE3.

The third gate electrode GE3 may extend in the second direction DR2 and may have a configuration commonly provided (or arranged) to the first to third color pixels PXL1 to PXL3. The third gate electrode GE3 may be a second conductive layer provided and/or formed on the gate insulating layer GI. The third gate electrode GE3 may be electrically connected to the sensing signal line SSL through the contact hole CH penetrating the interlayer insulating layer ILD. Accordingly, a control signal applied to the sensing signal line SSL may be transmitted to the third gate electrode GE3.

Although the above embodiment describes that the third gate electrode GE3 has a configuration different (or non-integral) from the sensing signal line SSL to be electrically connected to the sensing signal line SSL through the corresponding contact hole CH, the present disclosure is not limited thereto. In some embodiments, the third gate electrode GE3 may also be provided integrally with the sensing signal line SSL. In this case, the third gate electrode GE3 may be provided as a part of the sensing signal line SSL or may be provided in a shape protruding from the sensing signal line SSL.

The third active pattern ACT3, the third source region SE3, and the third drain region DE3 may be semiconductor patterns formed of poly silicon, amorphous silicon, an oxide semiconductor, or so on. The third active pattern ACT3, the third source region SE3, and the third drain region DE3 may be formed as semiconductor layers undoped with impurities or doped with impurities. For example, the third source region SE3 and the third drain region DE3 may be formed of semiconductor layers doped with impurities, and the third active pattern ACT3 may be formed of a semiconductor layer undoped with impurities. The impurities may include, for example, an n-type impurity.

The third active pattern ACT3, the third source region SE3, and the third drain region DE3 may be provided and/or formed on the buffer layer BFL.

The third active pattern ACT3 may be a region overlapping the third gate electrode GE3 and may be a channel region of the third transistor M3.

The third source region SE3 may be connected (or contacted) to one end of the third active pattern ACT3. In addition, the third source region SE3 may be electrically connected to the first bottom metal layer BML1 through the contact hole CH penetrating the buffer layer BFL.

The third drain region DE3 may be connected (or contacted) to the other end of the third active pattern ACT3. In addition, the third drain region DE3 may be electrically connected to the sensing line SENL/IPL through the seventh connection line CNL7.

The first storage capacitor Cst1 may include a first lower electrode LE1 and a first upper electrode UE1. Here, the first storage capacitor Cst1 may be the storage capacitor Cst of FIG. 9.

The first lower electrode LE1 may be provided integrally with the first gate electrode GE1. When the first lower electrode LE1 is provided integrally with the first gate electrode GE1, the first lower electrode LE1 may be one area of the first gate electrode GE1.

When viewed in a plane, the first upper electrode UE1 is arranged to overlap the first lower electrode LE1 and may have a larger area (or size) than the first lower electrode LE1. When viewed in a plane, the first upper electrode UE1 may overlap each of the first and third source areas SE1 and SE3. The first upper electrode UE1 may be a third conductive layer provided and/or formed on the interlayer insulating layer ILD. The first upper electrode UE1 may be provided and/or formed on the same layer as the scan line SL, the sensing signal line SSL, and the first and second sub power lines SPL1 and SPL2. In one embodiment of the present disclosure, the first upper electrode UE1 may include a first bridge pattern BRP1 extending to each of adjacent pixels PXL in the first direction DR1. The first bridge pattern BRP1 may be provided integrally with the first upper electrode UE1. In this case, the first bridge pattern BRP1 may be one area (or portion) of the first upper electrode UE1.

The first upper electrode UE1 may be electrically connected to the first bottom metal layer BML1 through the contact hole CH sequentially penetrating the buffer layer BFL, the gate insulating layer GI, and the interlayer insulating layer ILD. The first upper electrode UE1, the first source region SE1 of the first transistor M1, and the third source region SE3 of the third transistor M3 may be connected to each other through the first bottom metal layer BML1.

The first to third transistors M1 to M3, a second storage capacitor Cst2, and a second bottom metal layer BML2 may be arranged in the second pixel circuit area PXCA2 in which the second color pixel PXL2 is arranged.

The first transistor M1 of the second color pixel PXL2 may include the first gate electrode GE1, the first active pattern ACT1, the first source region SE1, and the first drain region DE1.

The first drain region DE1 of the first transistor M1 may be electrically connected to the first power line PL1 through a ninth connection line CNL9.

The ninth connection line CNL9 may be a third conductive layer provided and/or formed on the interlayer insulating layer ILD. The ninth connection line CNL9 may be electrically connected to the first power line PL1 through the contact hole CH sequentially penetrating the buffer layer BFL, the gate insulating layer GI, and the interlayer insulating layer ILD. In addition, the ninth connection line CNL9 may be electrically connected to the first drain region DE1 through the contact hole CH sequentially penetrating the gate insulating layer GI and the interlayer insulating layer ILD.

The second transistor M2 of the second color pixel PXL2 may include the second gate electrode GE2, the second active pattern ACT2, the second source region SE2, and the second drain region DE2.

The second source region SE2 of the second transistor M2 may be electrically connected to the first gate electrode GE1 of the first transistor M1 of the second color pixel PXL2 through a fourth connection line CNL4.

The fourth connection line CNL4 may be a third conductive layer provided and/or formed on the interlayer insulating layer ILD. One end of the fourth connection line CNL4 may be electrically connected to the first gate electrode GE1 through the contact hole CH penetrating the interlayer insulating layer ILD. The other end of the fourth connection line CNL4 may be electrically connected to the second source region SE2 through the contact hole CH sequentially penetrating the gate insulating layer GI and the interlayer insulating layer ILD.

The second drain region DE2 of the second transistor M2 of the second color pixel PXL2 may be electrically connected to the second data line DL2 through a third connection line CNL3. Here, the third connection line CNL3 may be a third conductive layer provided and/or formed on the interlayer insulating layer ILD. One end of the third connection line CNL3 may be electrically connected to the second data line DL2 through the contact hole CH sequentially penetrating the buffer layer BFL, the gate insulating layer GI, and the interlayer insulating layer ILD. The other end of the third connection line CNL3 may be electrically connected to the second drain region DE2 through the contact hole CH sequentially penetrating the gate insulating layer GI and the interlayer insulating layer ILD.

The second storage capacitor Cst2 may have the same structure as the first storage capacitor Cst1 of the first color pixel PXL1. For example, the second storage capacitor Cst may include a second lower electrode LE2 and a second upper electrode UE2. The second lower electrode LE2 may be a second conductive layer provided on the gate insulating layer GI. The second lower electrode LE2 may be provided integrally with the first gate electrode GE1 of the first transistor M1 of the second color pixel PXL2. The second upper electrode UE2 may be a third conductive layer provided on the interlayer insulating layer ILD and may overlap with the second lower electrode LE2 when viewed in a plane.

The second bottom metal layer BML2 may be provided and/or formed on the same layer as the first bottom metal layer BML1. For example, the second bottom metal layer BML2 may be a first conductive layer provided on the base layer BSL. The second bottom metal layer BML2 may be electrically connected to the first source region SE1, the third source region SE3, and the second upper electrode UE2. Specifically, the second bottom metal layer BML2 may be electrically connected to each of the first and third source regions SE1 and SE3 through the contact hole CH penetrating the buffer layer BFL. In addition, the second bottom metal layer BML2 may be electrically connected to the second upper electrode UE2 through the contact hole CH sequentially penetrating the buffer layer BFL, the gate insulating layer GI, and the interlayer insulating layer ILD. The first and third source regions SE1 and SE3 and the second upper electrode UE2 may be electrically connected to each other through the second bottom metal layer BML2.

The first to third transistors M1 to M3, a third storage capacitor Cst3, and a third bottom metal layer BML3 may be arranged in the third pixel circuit area PXCA3 in which the third color pixel PXL3 is arranged.

The first transistor M1 of the third color pixel PXL3 may include the first gate electrode GE1, the first active pattern ACT1, the first source region SE1, and the first drain region DE1.

The first drain region DE1 of the first transistor M1 may be electrically connected to the first power line PL1 through the ninth connection line CNL9. The ninth connection line CNL9 may be electrically connected to the first power line PL1 through the contact hole CH sequentially penetrating the buffer layer BFL, the gate insulating layer GI, and the interlayer insulating layer ILD. In addition, the ninth connection line CNL9 may be electrically connected to the first drain region DE1 through the contact hole CH sequentially penetrating the gate insulating layer GI and the interlayer insulating layer ILD.

The second transistor M2 of the third color pixel PXL3 may include the second gate electrode GE2, the second active pattern ACT2, the second source region SE2, and the second drain region DE2.

The second source region SE2 of the second transistor M2 of the third color pixel PXL3 may be electrically connected to the first gate electrode GE1 of the first transistor M1 of the third color pixel PXL3 through a sixth connection line CNL6.

The sixth connection line CNL6 may be a third conductive layer provided and/or formed on the interlayer insulating layer ILD. One end of the sixth connection line CNL6 may be electrically connected to the first gate electrode GE1 through the contact hole CH penetrating the interlayer insulating layer ILD. The other end of the sixth connection line CNL6 may be electrically connected to the second source region SE2 through the contact hole CH sequentially penetrating the gate insulating layer GI and the interlayer insulating layer ILD.

The second drain region DE2 of the second transistor M2 of the third color pixel PXL3 may be electrically connected to the third data line DL3 through a fifth connection line CNL5. Here, the fifth connection line CNL5 may be a third conductive layer provided and/or formed on the interlayer insulating layer ILD. One end of the fifth connection line CNL5 may be electrically connected to the third data line DL3 through the contact hole CH sequentially penetrating the buffer layer BFL, the gate insulating layer GI, and the interlayer insulating layer ILD. The other end of the fifth connection line CNL5 may be electrically connected to the second drain region DE2 through the contact hole CH sequentially penetrating the gate insulating layer GI and the interlayer insulating layer ILD.

The third storage capacitor Cst3 may include a third lower electrode LE3 and a third upper electrode UE3.

The third lower electrode LE3 may be a second conductive layer provided on the gate insulating layer GI. The third lower electrode LE3 may be provided integrally with the first gate electrode GE1 of the first transistor M1 of the third color pixel PXL3.

The third upper electrode UE3 may be a third conductive layer provided on the interlayer insulating layer ILD and may overlap the third lower electrode LE3 when viewed in a plane. In one embodiment of the present disclosure, the third upper electrode UE3 may include a second bridge pattern BRP2 extending to the unit pixel area PXU of adjacent pixels PXL in the first direction DR1. The second bridge pattern BRP2 may be provided integrally with the third upper electrode UE3. In this case, the second bridge pattern BRP2 may be one area (or portion) of the third upper electrode UE3.

The third bottom metal layer BML3 may be provided and/or formed on the same layer as the first and second bottom metal layers BML1 and BML2. For example, the third bottom metal layer BML3 may be a first conductive layer provided on the base layer BSL. The third bottom metal layer BML3 may be electrically connected to the first source region SE1, the third source region SE3, and the third upper electrode UE3. For example, the third bottom metal layer BML3 may be electrically connected to each of the first and third source regions SE1 and SE3 through the contact hole CH penetrating the buffer layer BFL. In addition, the third bottom metal layer BML3 may be electrically connected to the third upper electrode UE3 through the contact hole CH sequentially penetrating the buffer layer BFL, the gate insulating layer GI, and the interlayer insulating layer ILD. The first and third source regions SE1 and SE3 and the third upper electrode UE3 may be electrically connected to each other through the third bottom metal layer BML3.

A passivation layer PSV may be provided and/or formed over the scan line SL, the sensing signal line SSL, the first and second sub power lines SPL1 and SPL2, the first to ninth connection lines CNL1 to CNL9, and the first to third upper electrodes UE1 to UE3.

The passivation layer PSV may be provided in a form including an organic insulating film, an inorganic insulating film, or an organic insulating film arranged on the inorganic insulating film. The inorganic insulating film may include at least one of metal oxides such as silicon oxide (SiOx), silicon nitride (SiNx), silicon oxynitride (SiOxNy), and aluminum oxide (AlOx). The organic insulating film may include at least one of, for example, acrylic resin, epoxy resin, phenolic resin, polyam ides resin, polyimide resin, unsaturated polyesters resin, poly-phenylen ethers resin, poly-phenylene sulfides resin, and benzocyclobutene resin.

The passivation layer PSV may include first contact holes CNT1 and second contact holes CNT2. The first contact hole CNT1 may expose each of one area (for example, one area of the first bridge pattern BRP1) of the first upper electrode UE1, one area of the second upper electrode UE2, and one area (for example, one area of the second bridge pattern BRP2) of the third upper electrode UE3. The second contact hole CNT2 may expose each of one area of the second sub power line SPL2, another area of the second sub power line SPL2, and another area of the second sub power line SPL2. In one embodiment of the present disclosure, there may be three first contact holes CNT1 provided in the unit pixel area PXU of each pixel unit PXU, and there may be three second contact holes CNT2 provided in the unit pixel area PXU.

A light emitting element layer DPL may be arranged on the passivation layer PSV. The light emitting element layer DPL may include the first light emitting area EA1, the second light emitting area EA2, and the third light emitting area EA3 sequentially arranged in the first direction DR1 in each unit pixel area PUA. First, second, and third light emitting portions EMU1, EMU2, and EMU3 may be formed in the first, second, and third light emitting areas EA1, EA2, and EA3, respectively.

Although FIGS. 10 and 11 illustrate a structure in which the first, second, and third light emitting areas EA1, EA2, and EA3 are arranged in a stripe shape in each unit pixel area PUA, the present disclosure is not limited thereto. For example, the first, second, and third light emitting areas EA1, EA2, and EA3 may also be alternately arranged in a delta (Δ) shape or so on in each unit pixel area PUA. In this case, it may be desirable to expand a width of a light conversion layer CCL (see FIG. 14) (e.g., a light conversion layer CCL having a set or predetermined color) and/or a width of a color filter CF (see FIG. 14) arranged on each of the first, second, and/or third light emitting areas EA1, EA2, and/or EA3. Accordingly, an aperture ratio of the pixel PXL may be increased.

A bank BNK may be arranged around the first, second, and third light emitting areas EA1, EA2, and EA3. For example, the bank BNK may be arranged in the non-light emitting areas NEA to surround each light emitting area EA. The non-light emitting area NEA may be an area or a portion other than the light emitting areas EA of the pixels PXL in the display area DA.

The light emitting element layer DPL may include the bank BNK, the alignment electrodes ELT, the light emitting elements LD, the first and second contact electrodes CNE1 and CNE2, the second contact electrode CNE2, and the first to third insulating layers INS1 to INS3.

The bank BNK may be a structure for defining (or partitioning) the light emitting area EA of each pixel PXL, for example, a pixel definition layer. In an embodiment of the present disclosure, the bank BNK may be located in the first non-light emitting areas NEA1 between the first to third light emitting areas EA1 to EA3 and the second non-light emitting areas NEA2 on an outer edge of the first to third light emitting areas EA1 to EA3. In an embodiment, the bank BNK may overlap each second power line PL2 (or one area of the second power line PL2) in the second non-light emitting areas NEA2 to completely cover the second power line PL2.

For example, the second power line PL2 may be located in the second non-light emitting areas NEA2 on both sides of each unit pixel area PXU, and the bank BNK in the second non-light emitting areas NEA2 may have a sufficient width to completely cover an upper portion of the second power line PL2. For example, the bank BNK may have a first width W1 in the first direction DR1 in the first non-light emitting areas NEA1 and may have a second width W2 greater than the first width W1 in the first direction DR1 in the second non-light emitting areas NEA2 located on both sides of each unit pixel area PXU. In an embodiment, when the second sub power line SPL2 is further arranged in the display area DA, the bank BNK may also be arranged to overlap the second sub power line SPL2. Accordingly, alignment of the light emitting elements LD may be prevented from being influenced by the second power line PL2.

The bank BNK may configure a dam structure for defining each light emitting area to which the light emitting elements LD are supplied during a process of supplying the light emitting elements LD to each pixel PXL. For example, as the first to third light emitting areas EA1 to EA3 are partitioned by the bank BNK, a mixed solution (for example, a light emitting element ink) including a target amount and/or type of light emitting elements may be introduced into each of the first to third light emitting areas EA1 to EA3.

In an embodiment, the bank BNK may be constituted to include at least one light blocking material and/or a reflective material, thereby being capable of preventing light leak between the respective pixels PXL and between adjacent pixels PXL. It may prevent defects. In another embodiment, the bank BNK may include a transparent material (or substance), and another light blocking layer and/or a reflective layer may be formed on the bank BNK. The transparent material may include, for example, polyam ides resin, polyimides resin, and so on but is not limited thereto.

The bank BNK may include a plurality of openings corresponding to the first to third light emitting areas EA1 to EA3 respectively. For example, the first to third light emitting areas EA1 to EA3 may be defined by openings of the bank BNK.

As the bank BNK is arranged in the non-light emitting area NEA to surround the first to third light emitting areas EA1 to EA3, areas in which the light emitting elements LD are supplied may be defined in each the unit pixel area PUA by supplying the light emitting elements LD only in the above-defined areas, material efficiency may be increased. In addition, by preventing other areas (for example, non-light emitting areas NEA) other than the defined areas, the number of light emitting elements LD that may be used as effective light sources in each light emitting area EA may be increased. For example, during a step of supplying the light emitting elements LD to each pixel PXL, the light emitting elements LD are prevented from being supplied to unnecessary areas, and the light emitting elements LD may be efficiently supplied to each of the first to third light emitting areas EA1 to EA3. Accordingly, it is possible to prevent the light emitting elements LD from being unnecessarily supplied and to reduce manufacturing cost of a display device.

In addition, the bank BNK may include openings for exposing the alignment electrodes ELT (or alignment lines before being separated into the alignment electrodes ELT) in the first to third light emitting areas EA1 to EA3. Open areas OPA in which the alignment electrodes ELT of the pixels PXL are separated by the openings may be defined. In an embodiment, the openings may be arranged above and/or below each light emitting area EA but are not limited thereto.

The bank BNK may be provided and/or formed on the first insulating layer INS1, but the present disclosure is not limited thereto. In some embodiments, the bank BNK may also be provided and/or formed on the passivation layer PSV.

The alignment electrodes ELT (also referred to as "pixel electrodes") of each pixel PXL may include the first electrode ELT1 and the second electrode ELT2 arranged in each light emitting area EA and may selectively further included at least one intermediate electrode IET. For example, the alignment electrodes ELT may include the first electrode ELT1, the second electrode ELT2, the first intermediate electrode IET1, and the second intermediate electrode IET2. In an embodiment, the first intermediate electrode IET1 and the second intermediate electrode IET2 may be formed with the first electrode ELT1 interposed therebetween and may be spaced from each other and may be connected to each other through the second contact electrode CNE2.

In an embodiment, the first electrode ELT1 may form the anode electrode AE1 of the first series stage, and the first intermediate electrode IET1 may form the cathode electrode CE1 of the first series stage. The second intermediate electrode IET2 may be integrally or non-integrally connected to the first intermediate electrode IET1 and may configure the anode electrode AE2 of the second series stage. The second electrode ELT2 may configure the cathode electrode CE2 of the second series stage.

In some embodiments, the second electrode ELT2, the second intermediate electrode IET2, the first electrode ELT1, and the first intermediate electrode IET1 may be sequentially arranged along the first direction DR1 in each light emitting area EA, but the present disclosure is not limited thereto. In addition, each alignment electrode ELT may extend in the second direction DR2 in each light emitting area EA but is not limited thereto. Each alignment electrode ELT may or may not have a curvature. For example, in the present disclosure, the number of alignment electrodes ELT, the position, shape, number, and/or mutual arrangement structure of each of the alignment electrodes ELT may be variously changed depending on embodiments. The alignment electrodes ELT may be a fourth conductive layer provided and/or formed on the passivation layer PSV.

At least one of the alignment electrodes ELT may be disconnected in the adjacent open area OPA. For example, both ends of each of the first electrode ELT1, the first intermediate electrode IET1, and the second intermediate electrode IET2 may be disconnected in open areas OPA above and below the corresponding light emitting area EA to be separated from other electrodes (for example, alignment electrodes ELT provided to adjacent pixels PXL in the second direction DR2).

The other electrodes of the alignment electrodes ELT may or may not be disconnected in the open area OPA. For example, both ends of the second electrode ELT2 may be connected or disconnected to the second electrodes ELT2 of adjacent pixels PXL by being connected in the open areas OPA above and below the corresponding light emitting area EA, or being disconnected in the open areas OPA.

The alignment electrodes ELT may be arranged to be spaced from each other in each light emitting area EA, and the light emitting elements LD may be arranged between the alignment electrodes ELT. In an embodiment, an interval between a pair of alignment electrodes ELT constituting each series stage may be uniform in the light emitting area EA or may be different for each area. For example, in the embodiment of FIG. 11, the alignment electrodes ELT are arranged at uniform intervals but may vary depending on embodiments. For example, in another embodiment, by narrowly forming an interval between the alignment electrodes ELT receiving different alignment signals in correspondence with an area (e.g., a set or predetermined area) in which the light emitting elements LD are to be arranged, the light emitting elements LD may be collectively arranged in a desirable area.

The alignment electrodes ELT may be formed of a material with constant reflectance to cause the light emitted from each of the light emitting elements LD to travel in an image display direction (for example, a front direction) of the display device DD. For example, the alignment electrodes ELT may be formed of a conductive material (or substance) with constant reflectance. The conductive material (or substance) may include an opaque metal that is suitable for reflecting light emitted from the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. In some embodiments, the alignment electrodes ELT may include a transparent conductive material (or substance). The transparent conductive material (or substance) may include conductive oxide such as indium tin oxide (ITO), indium zinc oxide (IZO), zinc oxide (ZnO), indium gallium zinc oxide, IGZO), or indium tin zinc oxide (ITZO), and a conductive polymer such as poly(3,4-ethylenedioxythiophene) (PEDOT). When the alignment electrodes ELT include a transparent conductive material (or substance), another conductive layer formed of an opaque metal may also be added to reflect light emitted from the light emitting elements LD in the image display direction of the display device. However, materials of the alignment electrodes ELT are not limited to the above-described materials.

In addition, each of the alignment electrodes ELT may be provided and/or formed as a single layer but is not limited thereto. In some embodiments, each of the alignment electrodes ELT may also be provided and/or formed as a multilayer structure in which at least two of metal, alloy, conductive oxide, and conductive polymer are stacked. Each of the alignment electrodes ELT may also be formed as multiple layers of at least double layers or more to reduce or minimize distortion due to signal delay when a signal (or voltage) is transmitted to both end portions of each of the light emitting elements LD. For example, each of the alignment electrodes ELT may also be formed as multiple layers in which indium tin oxide (ITO), silver (Ag), and indium tin oxide (ITO) are sequentially stacked.

In each of the first to third light emitting areas EA1 to EA3, the first electrode ELT1 may be electrically connected to a part of the corresponding pixel circuit layer PCL through the first contact hole CNT1 of the passivation layer PSV. For example, the first electrode ELT1 of the first light emitting area EA1 may be electrically connected to the first bridge pattern BRP1 disposed in the first pixel circuit area PXCA1 through the first contact hole CNT1 that is one of the three first contact holes CNT1 of the passivation layer PSV. The first electrode ELT1 of the second light emitting area EA2 may be electrically connected to the second upper electrode UE2 disposed in the second pixel circuit area PXCA2 through another first contact hole CNT1 of the three first contact holes CNT1. The first electrode ELT1 of the third light emitting area EA3 may be electrically connected to the second bridge pattern BRP2 disposed in the third pixel circuit area PXCA3 through the other first contact hole CNT1 of the three first contact holes CNT1. As described above, because the first bridge pattern BRP1 is one area (or a part) of the first upper electrode UE1, the first electrode ELT1 of the first light emitting area EA1 may be electrically connected to the first upper electrode UE1. In addition, because the second bridge pattern BRP2 is one area (or a part) of the third upper electrode UE3, the first electrode ELT1 of the third light emitting area EA3 may be electrically connected to the third upper electrode UE3.

In each of the first to third light emitting areas EA1 to EA3, the second electrode ELT2 may be electrically connected to a part of the corresponding pixel circuit layer PCL through the second contact hole CNT2 of the passivation layer PSV. For example, the second electrode ELT2 of the first light emitting area EA1 may be electrically connected to the second sub power line SPL2 corresponding to the first light emitting area EA1 through one of the three second contact holes CNT2 of the passivation layer PSV. The second electrode ELT2 of the second light emitting area EA2 may be electrically connected to the second sub power line SPL2 corresponding to the second light emitting area EA2 through another second contact hole CNT2 of the three second contact holes CNT2. The second electrode ELT2 of the third light emitting area EA3 may be electrically connected to the second sub power line SPL2 corresponding to the third light emitting area EA3 through the other second contact hole CNT2 of the three second contact holes CNT2.

The bank patterns BNP (or an integrated bank pattern having an uneven surface or an opening) may be selectively arranged between each of the alignment electrodes ELT and the passivation layer PSV. For example, in an embodiment, as illustrated in FIG. 12, the alignment electrodes ELT may be formed on the passivation layer PSV. In another embodiment, as illustrated in FIG. 13, the bank patterns BNP may be arranged on the passivation layer PSV, and alignment electrodes ELT may be formed on the bank patterns BNP.

The bank patterns BNP may be located in the light emitting areas EA of each pixel unit PXU. For example, the bank patterns BNP may be located in each of the first to third light emitting areas EA1 to EA3. The bank patterns BNP may be arranged under the alignment electrodes ELT to change a surface profile (or shape) of each of the alignment electrodes ELT in a corresponding area to guide light emitted from the light emitting elements LD in an image display direction of a display device.

The bank patterns BNP may be an inorganic insulating film including an inorganic material or an organic insulating film including an organic material. In some embodiments, the bank patterns BNP may include a single layer of an organic insulating film and/or a single layer of an inorganic insulating film, but the present disclosure is not limited thereto. In some embodiments, the bank patterns BNP may also be provided in the form of a multilayer in which at least one organic insulating film and at least one inorganic insulating film are stacked. However, the material of the bank patterns BNP is not limited to the above-described embodiment, and in some embodiments, the bank patterns BNP may also include a conductive material (or substance).

The bank patterns BNP may have a trapezoidal cross section of which width becomes narrower toward an upper portion in the third direction DR3 from one surface (for example, upper surface) of the passivation layer PSV, but the present disclosure is not limited thereto. For example, the bank patterns BNP may also have curved surfaces of a cross section such as a semi-ellipse shape and a semi-circle shape (or hemispherical shape) of which width is narrowed from one surface of the passivation layer PSV toward an upper portion in the third direction DR3. When viewed in a cross section, the shapes of the bank patterns BNP are not limited to the above-described embodiments and may be variously changed within a range in which efficiency of light emitted from each of the light emitting elements LD is increased.

Each of the alignment electrodes ELT may be provided and/or formed on the bank patterns BNP. Accordingly, the alignment electrodes ELT may have a surface profile corresponding to the shapes of the bank patterns BNP arranged below each of the alignment electrodes ELT. Accordingly, light emitted from the light emitting elements LD may be reflected by the alignment electrodes ELT to further travel in the image display direction (for example, a direction of a viewing angle range (e.g., a set or predetermined viewing angle range) including the third direction DR3) of the display device DD. Each of the bank patterns BNP and the alignment electrodes ELT may function as a reflective member that increases light efficiency of the display device DD by inducing light emitted from the light emitting elements LD in a desirable direction. When each pixel unit PXU does not include the bank patterns BNP, the alignment electrodes ELT may be provided and/or formed on one surface (for example, upper surface) of the passivation layer PSV.

The alignment electrodes ELT may receive an alignment signal (e.g., a set or predetermined alignment signal) (or alignment voltage) before the light emitting elements LD are aligned in the unit pixel area PXU of each pixel unit PXU and may be used as alignment lines for alignment of the light emitting elements LD. For example, in each of the first to third light emitting areas EA1 to EA3, the first electrode ELT1 and the second intermediate electrode IET2 may be used as a first alignment line by receiving a first alignment signal (or a first alignment voltage), and the second electrode ELT2 and the first intermediate electrode IET1 may be used as a second alignment line by receiving a second alignment signal (or a second alignment voltage). In another embodiment, three or more alignment signals or alignment voltages may be applied to each light emitting area EA to align the light emitting elements LD, and in this case, the alignment electrodes ELT may be divided into three or more alignment lines to be used.

After alignment of the light emitting elements LD is completed, at least some alignment lines (for example, first and/or second alignment lines) in each separation area OPA may be disconnected to drive each pixel PXL independently (or individually) from adjacent pixels PXL. In an embodiment, the alignment electrodes ELT separated through a disconnection process such as etching may be used as drive electrodes for driving the pixels PXL.

The light emitting elements LD may be arranged and/or connected between the first and second electrodes ELT1 and ELT2. For example, the light emitting elements LD may include at least one first light emitting element LD1 (for example, a plurality of the first light emitting elements LD1) arranged and/or connected between the first electrode ELT1 and the first intermediate electrode IET1, and at least one second light emitting element LD2 (for example, a plurality of the second light emitting elements LD2) arranged and/or connected between the second intermediate electrode IET2 and the second electrode ELT2. Hereinafter, it is assumed that the plurality of first light emitting elements LD1 and the plurality of second light emitting elements LD2 are arranged in the series stages respectively.

The light emitting elements LD may be light emitting diodes having a size as small as nanoscale to microscale as an example of a micro-sized device formed of a material having an inorganic crystal structure. The light emitting elements LD may be micro light emitting diodes formed by an etching method or micro light emitting diodes formed by a growth method.

A plurality of light emitting elements LD may be arranged and/or provided in each of the first to third light emitting areas EA1 to EA3, but the number of light emitting elements LD is not limited thereto. In some embodiments, the number of light emitting elements LD arranged and/or provided in each of the first to third light emitting areas EA1 to EA3 may be variously changed.

Each of the light emitting elements LD may emit light of any one color and/or white light. When viewed in a plane and in a cross section, the light emitting elements LD may be aligned on the first insulation layer INS1 between a pair of alignment electrodes ELT so that an extension direction (or a length L direction) is parallel to the first direction DR1. The light emitting elements LD may be prepared in a form sprayed in a solution and may be introduced into each of the first to third light emitting areas EA1 to EA3.

The light emitting elements LD may be introduced into each of the first to third light emitting areas EA1 to EA3 of each pixel unit PXU by using an inkjet printing method, a slit coating method, or various other methods. For example, the light emitting elements LD may be mixed with a volatile solvent and supplied to the unit pixel area PXU through the inkjet printing method or the slit coating method. In this case, when alignment signals of different potentials are supplied to at least one pair of alignment electrodes ELT provided in each of the first to third light emitting areas EA1 to EA3, an electric field may be formed between the pair of alignment electrodes ELT. Accordingly, the light emitting elements LD may be aligned between the pair of alignment electrodes ELT.

The light emitting elements LD may be supplied and/or arranged on the first insulating layer INS1 arranged on the alignment electrodes ELT. After the light emitting elements LD are aligned, the solvent may be volatilized or removed by using any other method to finally align and/or provide the light emitting elements LD in each of the first to third light emitting areas EA1 to EA3.

The first insulating layer INS1 may include an inorganic insulating film formed of an inorganic material or an organic insulating film formed of an organic material. In one embodiment of the present disclosure, the first insulating layer INS1 may be formed of an inorganic insulating film that is suitable for protecting the light emitting elements LD from the pixel circuit layer PCL of each pixel unit PXU. For example, the first insulating layer INS1 may include at least one of metal oxides such as silicon nitride (SiNx), silicon oxide (SiOx), silicon oxynitride (SiOxNy), and aluminum oxide (AlOx) but is not limited thereto. In some embodiments, the first insulating layer INS1 may also be formed of an organic insulating film that is suitable for flattening support surfaces of the light emitting elements LD.

The first insulating layer INS1 may include a via hole VH that expose one area (or portion) of each of the alignment electrodes ELT or is formed in an area corresponding to one area (or portion) of each of the alignment electrodes ELT. Accordingly, the alignment electrodes ELT may be connected to the contact electrodes CNE.

The second insulating layer INS2 may be provided and/or formed on each of the light emitting elements LD. The second insulating layer INS2 may be provided and/or formed on each of the light emitting elements LD to partially cover an outer surface (e.g., an outer circumferential surface or an outer peripheral surface) (or a surface) of each of the light emitting elements LD, and the first and second end portions EP1 and EP2 may be exposed.

The second insulating layer INS2 may be constituted by a single layer or multiple layers and may include an inorganic insulating film including at least one inorganic material or an organic insulating film including at least one organic material. The second insulating layer INS2 may further fix each of the light emitting elements LD. The second insulating layer INS2 may include an inorganic insulating film that is suitable for protecting the light emitting elements LD from external oxygen and moisture. However, the present disclosure is not limited thereto. The second insulating layer INS2 may also be formed of an organic insulating film including an organic material depending on design conditions of a display device in which the above-described light emitting elements LD are applied as a light source.

After the alignment of the light emitting elements LD in each of the first to third light emitting areas EA1 to EA3 of each pixel unit PXU is completed, the second insulating layer INS2 is formed on the light emitting elements LD, thereby preventing the light emitting elements LD from being separated from the aligned positions. When there is an empty gap (or space) between the first insulating layer INS1 and the light emitting elements LD before the second insulating layer INS2 is formed, the gap may be filled with the second insulating layer INS2 during a process of forming the second insulating layer INS2. Accordingly, the second insulating layer INS2 may be constituted by an organic insulating film that is suitable for filling gaps between the first insulating layer INS1 and the light emitting elements LD.

The contact electrodes CNE may be provided and/or formed over the alignment electrodes ELT. The contact electrodes CNE may be a fifth conductive layer provided on the second insulating layer INS2. The contact electrodes CNE may be constituted to more stably and electrically connect the alignment electrodes ELT to the light emitting elements LD but are not limited thereto.

The contact electrodes CNE may include the first to third contact electrodes CNE1 to CNE3.

The first contact electrode CNE1 may be arranged over the first end portions EP1 of the first light emitting elements LD1 arranged in each light emitting area EA and the first electrode ELT1. The first contact electrode CNE1 may connect the first end portions EP1 of the first light emitting elements LD1 to the first electrode ELT1.

The second contact electrode CNE2 may be arranged over the second end portions EP2 of the first light emitting elements LD1 arranged in each light emitting area EA, the first end portions EP1 of the second light emitting elements LD2, and the intermediate electrode IET. The second contact electrode CNE2 may connect the second end portions EP2 of the first light emitting elements LD1 and the first end portions EP1 of the second light emitting elements LD2 to the intermediate electrode IET.

To this end, the second contact electrode CNE2 may include a 2-1$^{th}$ contact electrode portion CNE2-1 and a 2-2$^{th}$ contact electrode portion CNE2-2. The 2-1$^{th}$ contact electrode portion CNE2-1 and the 2-2$^{th}$ contact electrode portion CNE2-2 may be integrally or non-integrally connected to each other.

The 2-1$^{th}$ contact electrode portion CNE2-1 may be arranged over the second end portions EP2 of the first light emitting elements LD1 arranged in each light emitting area EA and the first intermediate electrode IET1. The 2-1$^{th}$ contact electrode portion CNE2-1 may connect the second end portions EP2 of the first light emitting elements LD1 to the first intermediate electrode IET1.

The 2-2$^{th}$ contact electrode portion CNE2-2 is arranged over the first end portions EP1 of the second light emitting elements LD2 arranged in each light emitting area EA and the second intermediate electrode IET2. The 2-2$^{th}$ contact electrode portion CNE2-2 may connect the first ends EP1 of the second light emitting elements LD2 to the second intermediate electrode IET2.

The third contact electrode CNE3 may be arranged over the second end portions EP2 of the second light emitting elements LD2 arranged in each light emitting area EA and the second electrode ELT2. The third contact electrode CNE3 may connect the second end portions EP2 of the second light emitting elements LD2 to the second electrode ELT2.

The contact electrodes CNE may be formed of various transparent conductive materials so that light emitted from each of the light emitting elements LD and reflected by the alignment electrodes ELT travels in an image display direction of a display device without loss. For example, the contact electrodes CNE may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and so on, and may be substantially transparent or translucent to satisfy predetermined light transmittance (or penetrance). However, the materials of the contact electrodes CNE are not limited to the above-described embodiment. In some embodiments, the contact electrodes CNE may also be formed of various opaque conductive materials (or substances). The contact electrodes CNE may also be constituted by a single layer or multiple layers.

When viewed in a plane, each of the contact electrodes CNE may generally have a shape extending in the second direction DR2 but is not limited thereto. For example, the shapes of the contact electrodes CNE may be variously changed within a range in which the contact electrodes are stably and electrically connected to the light emitting elements LD. In addition, the shapes of the first and second contact electrodes CNE1 and CNE2 may be variously changed in consideration of a connection relationship between the alignment electrodes ELT arranged under the first and second contact electrodes CNE1 and CNE2.

In an embodiment, the contact electrodes CNE may be provided on the same layer and may be formed through the same process. For example, the first to third contact electrodes CNE1 to CNE3 may be provided and/or formed on the second insulating layer INS2. However, the present disclosure is not limited thereto, and in some embodiments, some of the contact electrodes CNE and the other portions may be provided on different layers and may also be sequentially formed through different processes. In this case, an additional insulating layer may be interposed between some of the contact electrodes CNE and the other portion of the other contact electrodes CNE.

The third insulating layer INS3 may be provided and/or formed on the contact electrodes CNE. The third insulating layer INS3 may be an inorganic insulating film including an inorganic material or an organic insulating film including an organic material. For example, the third insulating layer INS3 may have a structure in which at least one inorganic insulating film or at least one organic insulating film is alternately stacked. The third insulating layer INS3 may entirely cover the light emitting element layer DPL to prevent moisture or humidity from flowing into the light emitting element layer DPL including the light emitting elements LD.

When it is assumed that a drive current flows from the first power line PL1 to the second power line PL2 by the first transistor M1 of each of the first to third color pixels PXL1 to PXL3, the drive current may flow into the light emitting unit EMU of the corresponding pixel PXL through the first contact hole CNT1 of the corresponding sub-pixel. Accordingly, each light emitting unit EMU may be driven by each pixel circuit PXC.

FIG. 14 is a cross-sectional view illustrating the display device DD according to an embodiment of the present disclosure. FIG. 14 schematically illustrates a cross section of the display panel PNL centering around an area of the display area DA corresponding to the lines II-II' of FIGS. 10 and 11. Because an example structure of each pixel PXL and the pixel unit PXU including the same is described in detail through the above-described embodiments, detailed description thereof will not be repeated.

Referring to FIGS. 1-14, an upper substrate UPL may be arranged on one surface of the base layer BSL on which the pixels PXL are formed. A light control layer LCP including the color filter CF and so on may be arranged on one surface of the upper substrate UPL. A suitable filler material (e.g., a set or predetermined filler material) FIL may be selectively filled between the pixels PXL and the upper substrate UPL.

The color filter CF may be arranged on one surface of the upper substrate UPL to face (or be opposite) the light emitting area EA of each pixel PXL. The color filter CF may include a color filter material capable of selectively transmitting light of a color corresponding to the color of each pixel PXL. A first light blocking pattern LBP1 may be arranged on an outer edge of the color filter CF.

Although FIG. 14 illustrates an embodiment in which the color filter CF is formed on the upper substrate UPL, the present disclosure is not limited thereto. For example, in another embodiment, the color filter CF may also be directly formed on one surface of the base layer BSL on which the pixels PXL are formed. For example, the color filter CF may be formed on a thin film encapsulation layer that seals the pixels PXL.

In an embodiment, the light control layer LCP may also further include a light conversion layer CCL. The light conversion layer CCL may be arranged between each pixel PXL and the color filter CF and may include color conversion particles (for example, quantum dots QD of a suitable color (e.g., a set or predetermined color)) for converting light of a certain color emitted from the light emitting elements LD of the pixel PXL into light of another color. In addition, the light conversion layer CCL may selectively further include light scattering particles. A second light blocking pattern LBP2 may be arranged on an outer edge of the light conversion layer CCL.

For example, in a case where the pixel PXL is set as a red (or green) pixel and blue light emitting elements LD are arranged as a light source of the pixel PXL, the light conversion layer CCL including red (or green) quantum dots QD for converting blue light into red (or green) light may be arranged in an upper portion of the pixel PXL. In addition, a red (or green) color filter CF may be arranged on the light conversion layer CCL.

In some embodiments, in a case where the pixel PXL includes light emitting elements LD that emit light of the same color as the light of a color to be emitted from the pixel PXL, the light conversion layer CCL may not be arranged on the upper portion of the pixel PXL. Alternatively, the light conversion layer CCL may be arranged on the pixel PXL, and the light conversion layer CCL may not include color conversion particles. For example, the light conversion layer CCL may also include only light scattering particles. In another embodiment, even when the pixel PXL includes the light emitting elements LD that emit light of the same color as the light of a color to be emitted from the pixel PXL, the light conversion layer CCL including color conversion particles (for example, color conversion particles matching the color of the pixel PXL) may also be arranged on the upper portion of the pixel PXL.

In an embodiment, a width (for example, width in the first direction DR1) and/or an area of the light conversion layer CCL and/or the color filter CF may be greater than a width and/or an area of the corresponding light emitting area EA. In this case, luminance of the pixels PXL may be increased.

Figure 15:
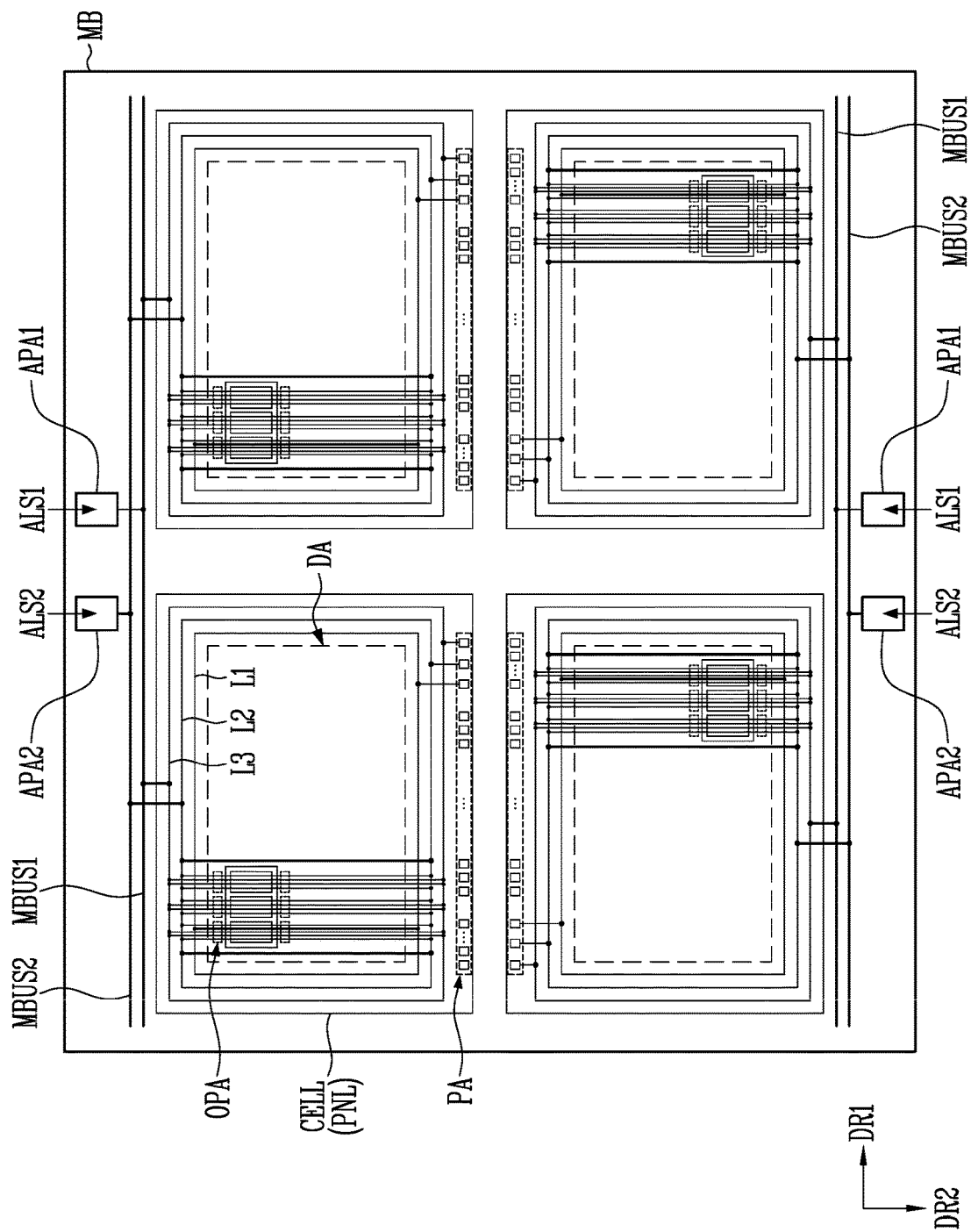
FIG. 15 is a plan view illustrating a mother board for manufacturing a display device according to an embodiment of the present disclosure and a method of applying alignment signals to each cell on the mother board.

FIG. 15 is a plan view illustrating a mother board MB for manufacturing the display device DD according to an embodiment of the present disclosure and a method of applying alignment signals to respective cells CELL on the mother board MB. A plurality of the cells CELL illustrated in FIG. 15 are concurrently formed (e.g., simultaneously formed) on the mother board MB, and then may be separated into respective display panels PNL. An example structure of the display panel PNL is described in detail through the above-described embodiments, and thus, detailed description thereof will not be repeated.

Figure 16:
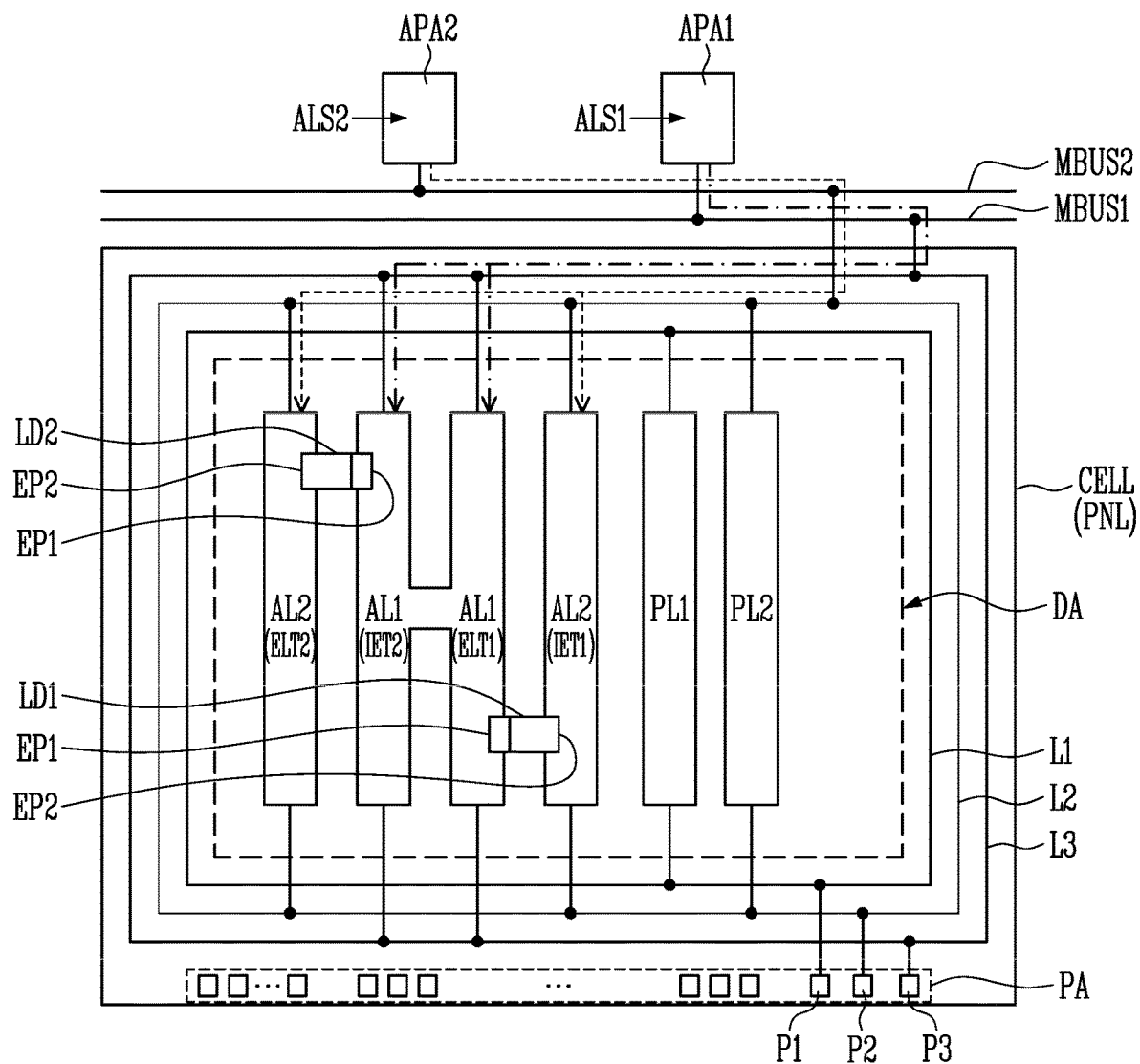
FIG. 16 is a plan view schematically illustrating a method of applying alignment signals to alignment lines of the respective cells on the mother board of FIG. 15.
Figure 17:
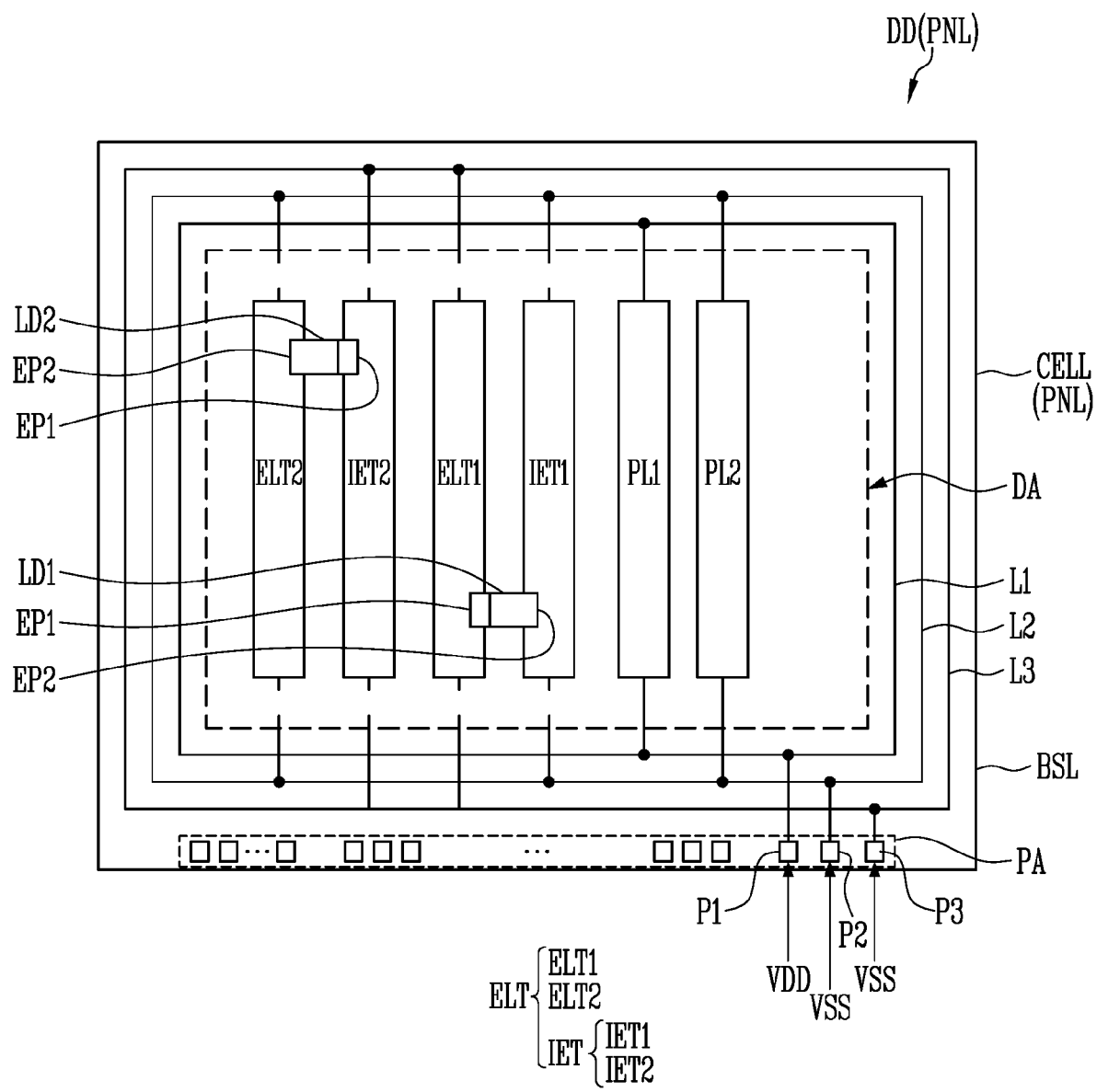
FIG. 17 is a plan view schematically illustrating a method of applying drive power supply voltages to a display panel separated from the mother board of FIG. 15.

FIG. 16 is a plan view schematically illustrating a method of applying alignment signals to alignment lines AL of each cell CELL on the mother board MB of FIG. 15. In addition, FIG. 17 is a plan view schematically illustrating a method of applying drive power supply voltages to the display panel PNL separated from the mother board MB of FIG. 15.

Referring to FIGS. 1-17, during a process of manufacturing a plurality of display panels PNL on the mother board MB, the alignment electrodes ELT may first extend in the second direction DR2 in the display area DA without being independently separated to configure the respective alignment lines AL. For example, the first electrodes ELT1 and the second intermediate electrodes IET2 of the pixels PXL may be integrally or non-integrally connected to be first formed as first alignment lines AL1. The second electrodes ELT2 and the first intermediate electrodes IET1 of the pixels PXL may be integrally or non-integrally connected to be formed as second alignment lines AL2.

In a step (or process) of aligning the light emitting elements LD, the first alignment lines AL1 may receive a first alignment signal ALS1 through a first alignment pad APA1 and a first bus line MBUS1 on the mother board MB and through a third line L3 of each cell and the second alignment lines AL2 may receive a second alignment signal ALS2 through a second alignment pad APA2 and a second bus line MBUS2 on the mother board MB and through second line L2 of each cell CELL.

The first alignment signal ALS1 and the second alignment signal ALS2 may be different signals. For example, the first and second alignment signals ALS1 and ALS2 may be signals having different potentials, voltages, and/or waveforms. Accordingly, an electric field may be formed between adjacent first and second alignment lines AL1 and AL2, and thereby, the light emitting elements LD may be aligned between the first and second alignment lines AL1 and AL2.

In an embodiment, an arrangement direction of the light emitting elements LD may be controlled by forming a magnetic field on the mother board MB and/or around the mother board MB during a period in which the light emitting elements LD are aligned. For example, the light emitting elements LD may be deflected to be aligned so that the first end portions EP1 of the light emitting elements LD supplied to each light emitting area EA may be directed toward the first alignment line A1 and the second end portions EP2 of the light emitting elements LD are directed toward the second alignment line AL2.

After the arrangement of the light emitting elements LD is completed, the first and/or second alignment lines AL1 and AL2 are disconnected in each open area OPA to separate the first and/or second alignment lines AL1 and AL2 into respective alignment electrodes ELT.

During a period in which the display device DD is driven after being manufactured, the first power supply voltage VDD may be supplied to the first power line PL1 through the first pad P1 and the first line L1, and the second power supply voltage VSS may be supplied to the second power line PL2 through the second pad P2 and the second line L2. Accordingly, drive power supply voltages may be supplied to the pixels PXL.

In an embodiment, the second power supply voltage VSS may be supplied to the third pad P3. In this case, the second power supply voltage VSS may be applied to the third line L3. In some embodiments, the third line L3 may also be used as a guard-ring or a shield line that shields the display area DA and the first and second lines L1 and L2 from an external environment.

According to various embodiments of the present disclosure described above, the bus line BLI (for example, the first line L1) connected to the first power line PL1 is formed separately from other bus lines BLI (for example, the second and third lines L2 and L3) used for aligning the light emitting elements LD. In this case, the first power line PL1 may be electrically floated during a step (or process) of aligning the light emitting elements LD. Accordingly, even in case that the first power line PL1 overlaps at least one light emitting area EA, it is possible to prevent or reduce the first power line PL1 from affecting the alignment of the light emitting elements LD.

According to the above-described embodiments, the light emitting areas EA may be designed regardless of a position or a location of the first power line PL1, and thus, areas of the light emitting areas EA may be prevented from being limited (or reduced) by the first power line PL1. Accordingly, a large number of the light emitting elements LD may be provided in each light emitting area EA by sufficiently obtaining a volume amount (or a floor area ratio) of each of the light emitting areas EA, and the light emitting elements LD may be stably aligned between the alignment electrodes ELT (or alignment lines AL before being separated into the alignment electrodes ELT). According to described embodiments of the present disclosure, a sufficient number of the light emitting elements LD may be provided to each light emitting area EA, and a utilization rate and a degree of alignment of the provided light emitting elements LD may be increased. Accordingly, light emission characteristics of each pixel PXL may be improved.

In addition, in the embodiments of the present disclosure, the second power line PL2 arranged on the outer edge areas of the unit pixel areas PXA and/or between adjacent unit pixel areas PXA may be formed in the non-light emitting areas NEA to be completely covered by the bank BNK. In this case, even when a suitable alignment signal (e.g., a predetermined alignment signal), for example, a second alignment signal, is applied to the second power line PL2 during a step (or process) of aligning the light emitting elements LD, a degree of alignment of the light emitting elements LD may be prevented from being reduced by the second alignment signal applied to the second power line PL2.

That is, the second power line PL2 may be covered by the bank BNK, and accordingly, the second power line PL2 and alignment electrodes (e.g., set or predetermined alignment electrodes) ELT (or the second alignment line AL2) may share any one bus line BLI (for example, the second line L2) of the bus lines BLI. Accordingly, the light emitting elements LD may be stably supplied and aligned between the alignment electrodes ELT, and also the non-display area NDA of the display panel PNL may be reduced or minimized.

Although the technical idea of the present disclosure is described in detail according to the above-described embodiments, it should be noted that the above-described embodiments are for the purpose of description and not for the limitation thereof. In addition, those skilled in the technical field of the present disclosure will appreciate that various modification examples are possible within the scope of the technical idea of the present disclosure.

The scope of the present disclosure is not limited to the content described in the present disclosure but should be defined by the scope of the claims and their equivalents. In addition, the meaning and scope of the claims, and all altered or modified forms derived from the concept of equivalents thereof should be construed as being included in the scope of the present disclosure.

What is claimed is:

1. A display device comprising:
a base layer including a display area and a non-display area;
pixels in the display area, each of the pixels comprising a first electrode and a second electrode located in a light emitting area and light emitting elements arranged between the first electrode and the second electrode;
a bank in the display area and surrounding the light emitting area of each of the pixels;
a first power line in the display area, a portion of the first power line overlapping the light emitting area of at least one of the pixels;
a second power line in the display area, an upper surface of the second power line being completely covered by the bank, the second power line not being covered by the light emitting area of each of the pixels;
a first line in the non-display area and connected to the first power line, the first line comprising a first portion between the display area and a pad portion of the display device, and a second portion facing the first portion with the display area interposed therebetween, respective ends of the first power line being connected to the first portion and the second portion of the first line;
a second line in the non-display area and connected to the second power line; and
a third line in the non-display area and separated from the pixels, the first power line, and the second power line,
wherein the light emitting elements comprise:
at least one first light emitting element connected between the first electrode and at least one of a first intermediate electrode or a second intermediate electrode, and comprising a first end portion and a second end portion; and
at least one second light emitting element connected between the second electrode and at least one of the first intermediate electrode or the second intermediate electrode, and comprising a first end portion and a second end portion,
wherein each of the pixels further comprises:
a first contact electrode on the first electrode and the first end portion of the first light emitting element;
a second contact electrode on the intermediate electrode, the second end portion of the first light emitting element, and the first end portion of the second light emitting element; and
a third contact electrode on the second electrode and the second end portion of the second light emitting element,
wherein:
the intermediate electrode comprises the first intermediate electrode and the second intermediate electrode that are spaced from each other, wherein the first electrode is interposed between the first intermediate electrode and the second intermediate electrode; and
the first intermediate electrode and the second intermediate electrode are connected to each other through the second contact electrode.

2. The display device of claim 1, further comprising:
first conductive patterns, each having one end connected to the third line and extending toward the first electrode of each of adjacent pixels from among the pixels; and
second conductive patterns, each having one end connected to the second line and extending toward the second electrode of each of the adjacent pixels from among the pixels.

3. The display device of claim 2, wherein
another end of each of the first conductive patterns and the second conductive patterns is disconnected and floated in at least one open area around the adjacent pixels.

4. The display device of claim 1, wherein the pad portion in the non-display area,
wherein the pad portion comprises a first pad connected to the first line, a second pad connected to the second line, and a third pad connected to the third line.

5. The display device of claim 4, wherein:
the first pad is to receive first power supply voltage; and
the second pad and the third pad are to receive a second power supply voltage.

6. The display device of claim 5, wherein:
the first power supply voltage is a high-potential pixel power supply voltage; and the second power supply voltage is a low-potential pixel power supply voltage.

7. The display device of claim 4, wherein
each of the second, and third lines comprises a first portion between the display area and the pad portion, and a second portion facing the first portion with the display area interposed therebetween.

8. The display device of claim 7, wherein:
respective ends of the second power line are connected to the first portion and the second portion of the second line.

9. The display device of claim 7, wherein each of the first, second, and third lines further comprises a third portion located on one side of the display area and connecting the first portion and the second portion of a corresponding one of the first, second, and third lines, and a fourth portion that faces the third portion with the display area interposed therebetween and connects the first portion and the second portion of a corresponding one of the first, second, and third lines.

10. The display device of claim 1, wherein at least one of the first, second, and third lines has a shape of a closed loop surrounding the display area.

11. The display device of claim 1, wherein:
the pixels comprise first color pixels, second color pixels, and third color pixels; and
the display area comprises a pixel unit including one of the first color pixels, one of the second color pixels, and one of the third color pixels arranged adjacent to each other in one unit pixel area.

12. The display device of claim 11, wherein the pixel unit comprises:
a light emitting element layer comprising a first light emitting area, a second light emitting area, and a third light emitting area sequentially arranged in the unit pixel area along a first direction; and
a pixel circuit layer overlapping the light emitting element layer and including a first pixel circuit area, a second pixel circuit area, and a third pixel circuit area sequentially arranged in the unit pixel area along a second direction crossing the first direction.

13. The display device of claim 12, wherein:
the first power line overlaps at least one of the first, second, and third light emitting areas; and
the second power line is located on at least one side of the unit pixel area so as not to overlap the first, second, and third light emitting areas.

14. The display device of claim 13, wherein the bank has a first width in the first direction in first non-light emitting areas between the first, second, and third light emitting areas in the unit pixel area, and has a second width greater than the first width in the first direction in second non-light emitting areas on both sides of the unit pixel area.

15. The display device of claim 14, wherein the second power line is located in the second non-light emitting areas.

16. The display device of claim 1, wherein at least one of the first electrode and the second electrode is disconnected in at least one open area around the light emitting area of each of the pixels.

* * * * *